(12) United States Patent
Yonehara et al.

(10) Patent No.: US 9,523,158 B2
(45) Date of Patent: Dec. 20, 2016

(54) METHODS AND APPARATUS FOR FORMING SEMICONDUCTOR

(71) Applicant: Applied Materials, Inc., Santa Clara, CA (US)

(72) Inventors: Takao Yonehara, Sunnyvale, CA (US); Karl J. Armstrong, Sunnyvale, CA (US); Fatih Mert Ozkeskin, Union City, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 3 days.

(21) Appl. No.: 14/606,884

(22) Filed: Jan. 27, 2015

(65) Prior Publication Data
US 2015/0225876 A1    Aug. 13, 2015

Related U.S. Application Data

(60) Provisional application No. 61/937,205, filed on Feb. 7, 2014.

(51) Int. Cl.
*B32B 38/10*        (2006.01)
*C30B 33/00*        (2006.01)
(Continued)

(52) U.S. Cl.
CPC .............. *C30B 33/00* (2013.01); *C30B 25/02* (2013.01); *H01L 21/02005* (2013.01); *H01L 21/304* (2013.01); *H01L 21/306* (2013.01); *H01L 21/6776* (2013.01); *B32B 38/10* (2013.01); *B32B 43/006* (2013.01); *H01L 21/02513* (2013.01); *H01L 21/02658* (2013.01); *H01L 21/67092* (2013.01); *H01L 21/67383* (2013.01); *H01L 21/6838* (2013.01); *H01L 21/68721* (2013.01); *H01L 21/68764* (2013.01); *H01L 2221/683* (2013.01); *H01L 2221/68318* (2013.01); *H01L 2221/68363* (2013.01); *Y10T 156/1121* (2015.01); *Y10T 156/1132* (2015.01);
(Continued)

(58) Field of Classification Search
CPC .. B32B 38/10; B32B 43/006; Y10T 156/1121; Y10T 156/1132; Y10T 156/1922; Y10T 156/1944; H01L 21/67092; H01L 21/67032; H01L 21/67383; H01L 21/6838; H01L 21/68721; H01L 21/68764; H01L 2221/683; H01L 2221/68318; H01L 2221/68363
USPC    156/930, 931, 754, 758, 705, 707; 438/458, 459, 759
See application file for complete search history.

(56) References Cited

U.S. PATENT DOCUMENTS 6,221,740 B1 *  4/2001  Bryan ................. B28D 5/0011
                                                      125/23.01
6,274,459 B1 *  8/2001  Chan ................... H01L 21/2236
                                                      118/723 ER
(Continued)

*Primary Examiner* — Mark A Osele
*Assistant Examiner* — Nickolas Harm
(74) *Attorney, Agent, or Firm* — Patterson & Sheridan, LLP

(57) ABSTRACT

Method and apparatus for forming free-standing, substantially monocrystalline semiconductor substrates is described. A template substrate is subjected to a process of forming a porous layer on each major surface of the template substrate. The porous layer is smoothed, and then an epitaxial layer is formed on each porous layer. Mechanical energy is used to separate the epitaxial layers from the template substrate, which is recycled by removing any remaining porous and epitaxial material.

8 Claims, 12 Drawing Sheets

(51) Int. Cl.

| | |
|---|---|
| *C30B 25/02* | (2006.01) |
| *H01L 21/677* | (2006.01) |
| *H01L 21/304* | (2006.01) |
| *H01L 21/306* | (2006.01) |
| *B32B 43/00* | (2006.01) |
| *H01L 21/673* | (2006.01) |
| *H01L 21/683* | (2006.01) |
| *H01L 21/67* | (2006.01) |
| *H01L 21/687* | (2006.01) |
| *H01L 21/02* | (2006.01) |

(52) U.S. Cl.
CPC ........ *Y10T 156/19* (2015.01); *Y10T 156/1922* (2015.01); *Y10T 156/1944* (2015.01)

(56) References Cited

U.S. PATENT DOCUMENTS

| | | | | |
|---|---|---|---|---|
| 6,342,433 B1* | 1/2002 | Ohmi | ................ | H01L 21/76251 257/E21.567 |
| 6,686,598 B1* | 2/2004 | Walther | ............ | H01L 21/68721 250/443.1 |
| 7,811,900 B2* | 10/2010 | Henley | ............. | H01L 21/76254 438/458 |
| 7,902,091 B2* | 3/2011 | Ramappa | .......... | H01L 21/76254 257/E21.001 |
| 2002/0102777 A1* | 8/2002 | Sakaguchi | ........ | H01L 21/02203 438/149 |
| 2006/0131703 A1* | 6/2006 | Majumdar | .......... | H01L 51/0022 257/665 |
| 2006/0151014 A1* | 7/2006 | Obweger | .......... | H01L 21/67051 134/94.1 |
| 2006/0166468 A1* | 7/2006 | Yonehara | ................ | C30B 25/02 438/483 |
| 2007/0235426 A1* | 10/2007 | Matsumoto | ....... | H01J 37/32082 219/121.43 |
| 2007/0243652 A1* | 10/2007 | Bour | .................... | C23C 16/303 438/46 |
| 2007/0243702 A1* | 10/2007 | Nijhawan | ............... | C30B 25/02 438/602 |
| 2008/0266003 A1* | 10/2008 | Yamashita | ............... | H03B 5/32 331/68 |
| 2010/0022074 A1* | 1/2010 | Wang | ..................... | H01L 31/18 438/479 |
| 2010/0330776 A1* | 12/2010 | Zuniga | .......... | H01L 21/67092 438/455 |
| 2011/0253315 A1* | 10/2011 | George | ................. | B32B 43/006 156/718 |
| 2011/0256654 A1* | 10/2011 | Moslehi | ............. | H01L 31/1804 438/57 |
| 2012/0234887 A1* | 9/2012 | Henley | ............ | H01L 21/67092 225/1 |
| 2013/0105090 A1* | 5/2013 | Lee | ........................ | B32B 38/10 156/705 |

* cited by examiner

FIG. 9A
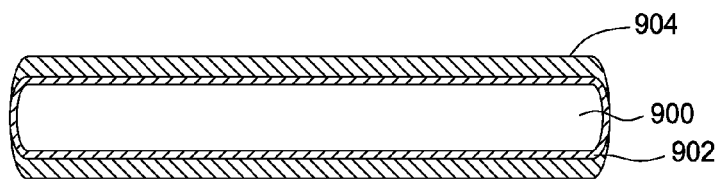
FIG. 9B
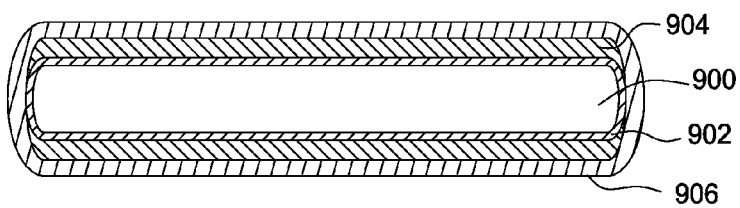
FIG. 9C
FIG. 9D
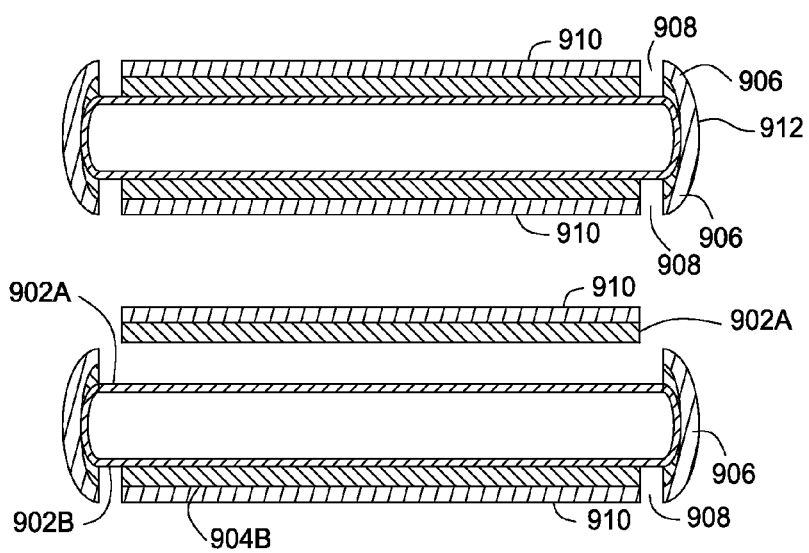
FIG. 9E
FIG. 9F

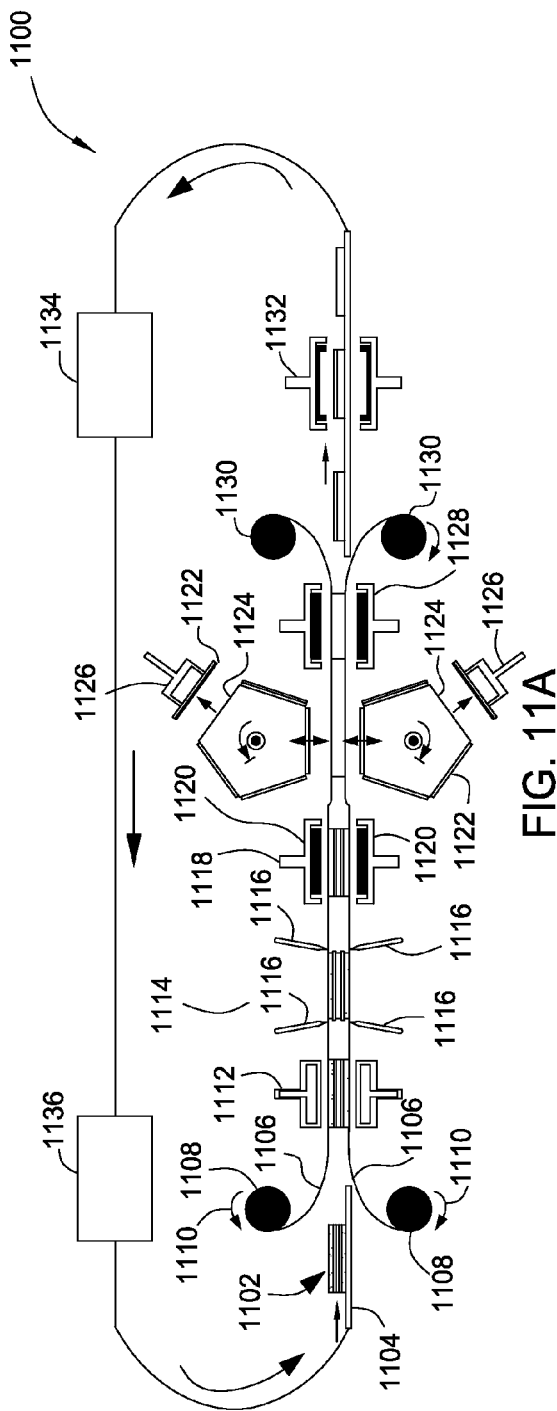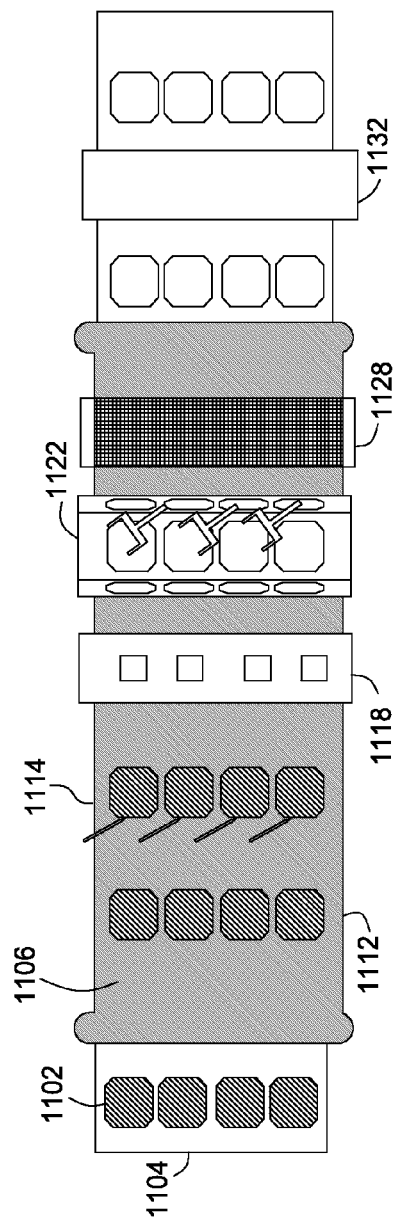

METHODS AND APPARATUS FOR FORMING SEMICONDUCTOR

CROSS-REFERENCE TO RELATED APPLICATIONS

This application claims benefit of U.S. Provisional Patent Application Ser. No. 61/937,205, filed Feb. 7, 2014, which is incorporated herein by reference.

FIELD

Embodiments described herein relate to methods of manufacturing semiconductor substrates. More specifically, embodiments described herein relate to manufacturing monocrystalline semiconductor substrates.

BACKGROUND

Semiconductor substrates are widely used in manufacturing various devices that operate based on the unique electromagnetic properties of semiconductor materials. In many cases, the semiconductor substrates have a monocrystalline, or single-crystal, morphology. Crystalline silicon substrates may be conventionally obtained by sawing a plate from an ingot or boule of single crystal silicon grown using the Czochralski or floating zone process. The process of sawing the substrate produces a waste stream of powdered silicon, known as the kerf, which is the pulverized remains of a portion of the ingot the thickness of the saw blade. The powdered silicon is typically recycled into a new ingot, but the kerf makes up a significant percentage of the ingot, and therefore increases the cost of each individual plate obtained from the ingot.

Crystalline silicon substrates may also be obtained conventionally by growing an epitaxial layer onto a single crystal template substrate using a CVD process. The epitaxial layer is then cleaved from the template substrate by peeling or water sawing. Devices may be formed on the substrate before or after cleaving from the template substrate. Cleaving may be facilitated by forming pores in the template substrate prior to growing the epitaxial layer thereon, or by implanting ions at a selected depth to form a cleave seam. "Handle" substrates are frequently bonded to the epitaxial layer to facilitate handling after cleaving.

Conventional epitaxy is a slow process. A substrate, such as the template substrate referred to above, is disposed in a CVD chamber and heated to a processing temperature. A precursor gas mixture is provided to the chamber, and a surface of the template substrate is exposed to the gas. A layer grows on the template substrate atom by atom until a desired thickness is reached. Growing a monocrystalline substrate to a reasonable thickness, such as 500 µm, can take hours since growth rates for monocrystalline materials are limited. Liquid phase epitaxy may be practiced under very stringent conditions, with morphological results strongly dependent on maintaining tight control of the deposition interface. Solid phase epitaxy may also be used to create monocrystalline layers, but such processes usually require a great deal of energy to recrystallize polycrystalline or amorphous materials.

New methods and apparatus are needed to make monocrystalline and/or epitaxial semiconductor substrates at high rates.

SUMMARY

Method and apparatus for forming free-standing, substantially monocrystalline semiconductor substrates is described. A template substrate is subjected to a process of forming a porous layer on each major surface of the template substrate. The porous layer is smoothed, and then an epitaxial layer is formed on each porous layer. Mechanical energy is used to separate the epitaxial layers from the template substrate, which is recycled by removing any remaining porous and epitaxial material.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 9A-9F are cross-sectional views of a substrate undergoing the methods of FIGS. 1, 2, 4, and 6.

FIG. 11A is a schematic side view of an apparatus for making epitaxial substrates according to one embodiment.

FIG. 11B is a plan view of the apparatus of FIG. 11A.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments described herein generally provide methods and apparatus for forming semiconductor substrates having a monocrystalline, substantially monocrystalline, or epitaxial morphology. Such substrates may be used in subsequent processing to form semiconductor devices such as logic, memory, communication, power, optical, illumination, or any other useful semiconductor devices. Crystalline silicon substrates are commonly used, for example, in photovoltaic applications, and crystalline compound semiconductor substrate are commonly used to make light emitting semiconductor devices. The substrates obtainable from the methods and apparatus described herein are formed by a dual-sided epitaxy process in which two major surfaces of a template substrate are concurrently subjected to an epitaxial growth process to form two epitaxial layers on the substrate, which are then cleaved using mechanical energy.

Figure 1:
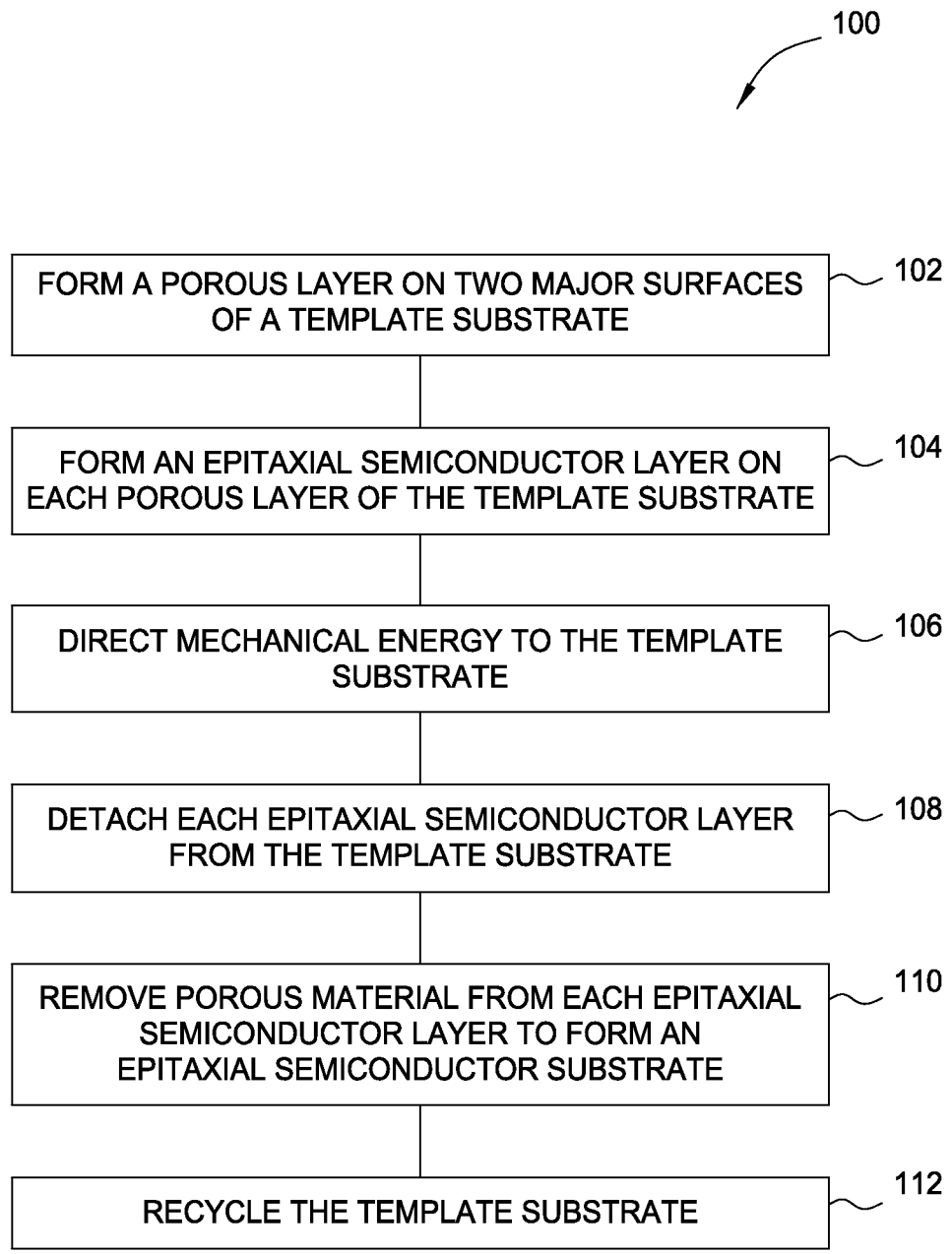
FIG. 1 is a flow diagram summarizing a method of making an epitaxial semiconductor substrate according to one embodiment.

FIG. 1 is a flow diagram summarizing a method 100 of forming epitaxial semiconductor substrates according to one embodiment. At 102, a porous layer is formed on two major surfaces of a template substrate. The template substrate is a semiconductor material that may have a similar morphology to the material of the desired epitaxial substrates. The template substrate may be silicon, a combination of semiconductor elements, such as silicon and germanium, or a compound semiconductor such as a III/V compound, a II/VI compound, a III/IV/V compound, a II/IV/VI compound, or other such compounds. The template substrate typically has a thickness larger than the desired thickness of the substrates to be obtained from the method 100. The thickness of the template substrate may be between about 50 μm and about 5 cm, such as between about 0.1 mm and about 3 cm, for example about 2 cm.

The porous layer is typically formed to a depth that will support cleaving the epitaxial substrate from the template substrate through the porous layer. Each porous layer may have a thickness between about 0.1 μm and about 3 μm, such as between about 0.5 μm and about 2 μm, for example about 1 μm. The porous layer may have a density between about 25% and about 75% of the density of the template substrate material. Forming the porous layer reduces the density of the template substrate material by forming pores in the material. The reduced density promotes selective fracturing of the porous material versus the dense material because the porosity reduces the strength of the material and its resistance to mechanical failure.

The porous layer on each surface of a template substrate may have a substantially constant thickness or a thickness that varies. For example, a first portion of the porous layer may have a first thickness and a second portion of the porous layer may have a second thickness different from the first thickness. Such embodiments may be useful for forming epitaxial layers having varying thickness on a single template substrate.

At 104, an epitaxial layer is formed on each of the porous layers formed at 102. The epitaxial layers may be formed concurrently or sequentially on the two major surfaces of the template substrate. The epitaxial layers are typically grown to a thickness such that they may be separated from the template substrate and separately handled without damage. The thickness of the layers may be between about 50 μm and about 500 μm, such as between about 100 μm and about 200 μm, for example about 150 μm.

At 106, mechanical energy is directed to the template substrate having the epitaxial layers formed thereon. The mechanical energy may be directed to the substrate by contact with a mechanical actuator or without contact through a medium of transmission. The mechanical energy stresses the material of the template substrate causing fracturing of the weak porous layers to enable separation of the epitaxial layers from the template substrate. The mechanical energy may be directed to both major surfaces of the template substrate concurrently or sequentially.

At 108, the epitaxial semiconductor layers are detached from the template substrate. The porous layers between the epitaxial layers and the body of the template substrate are weakened or fractured by the mechanical energy applied at 106, and the epitaxial layers may be separated using little or no force. If the fracturing of one or more of the porous layers is not complete, some peeling force may be applied to complete separation of the epitaxial layers.

At 110, any residue of the porous layers that may adhere to the detached epitaxial layers is removed to form epitaxial semiconductor substrates. The porous material may be removed by chemical means, physical means, or a combination thereof. The porous material may be etched by an etching chemistry that etches the porous material faster than dense material. Hydrogen containing plasma is one such chemistry. The porous material may also be removed in a planarization process such as CMP.

At 112, the template substrate is recycled. Any porous residue may be removed using any convenient process, such as those mentioned above. The template substrate may be recycled until a thickness thereof falls below a tolerance limit, such as 50 μm.

Figure 2:
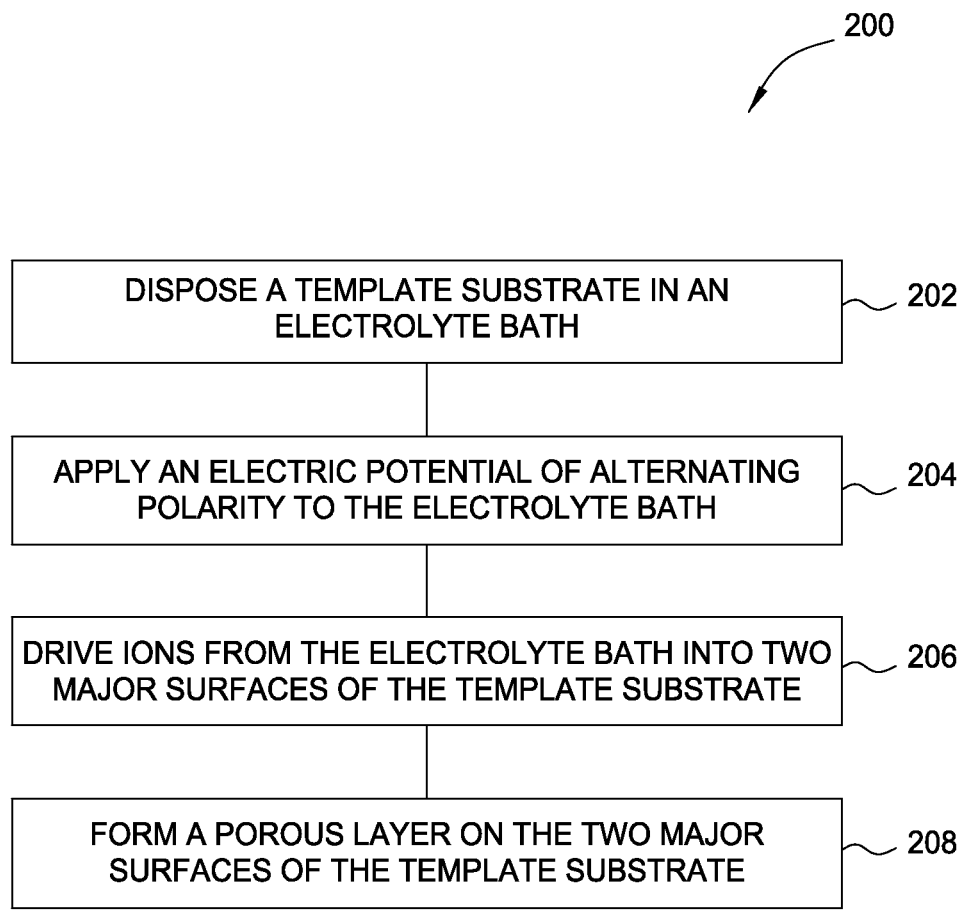
FIG. 2 is a flow diagram summarizing a method of forming a porous layer on a template substrate, which may be used in the method of FIG. 1.

FIG. 2 is a flow diagram summarizing a method 200 of forming porous layers on a substrate, which may be used with the method 100. The method 200 uses ions, under compulsion of an electric field, to penetrate and disrupt the surface of the template substrate, resulting in reduction in density. At 202, a template substrate is disposed in an electrolyte bath. The electrolyte bath is typically held in a container, and the template substrate may be immersed in the electrolyte bath in the container. Both major surfaces of the template substrate may be exposed to the electrolyte bath concurrently or sequentially. The electrolyte bath is a solution of ions, which may be an aqueous solution or a polar organic solution.

At 204, an electric potential is applied to the electrolyte bath. The electric potential is applied so as to produce an electric field oriented along a direction that intersects a major surface of the template substrate. The electric field may be perpendicular to the major surface of the template substrate.

At 206, ions from the electrolyte bath are driven into the major surface of the template substrate or react with the material of the surface, forming pores in the surface of the template substrate. The electric potential accelerates ions in the electrolyte bath in the direction of the electric field. The ions collide with, react with, and/or penetrate into, the surface of the template substrate, disrupting the structure of the atoms in the surface of the template substrate, or removing atoms from the surface, and reducing the local density at the surface.

The polarity of the electric potential may be reversed, if desired, to drive ions from the electrolyte bath toward a second major surface of the template substrate. The polarity of the electric potential may be alternated, if desired, to cyclically drive ions toward the two major surfaces of the template substrate.

The electrolyte bath may be any ionic solution subject to potentiation by an electric field. In one embodiment, the electrolyte bath may be a solution of HF in IPA. When a silicon substrate is immersed in such a solution and the solution subjected to an electric field, $F^-$ ions react with silicon to form a porous silicon surface. In another embodiment, the electrolyte bath may be an HX solution in a polar solvent such as water, alcohol, or a mixture thereof, where X is a halogen such as Cl, F, or Br.

At 208, the ions reduce the density at the surface of the template substrate, forming a porous layer. Depending on the time and intensity of the treatment, density of the surface material of the template substrate may be reduced by 25% to 75%. The porous layer thus formed typically has a density gradient, with the lowest density portion near the surface and the density rising monotonically to an interface between the porous layer and the dense body of the template substrate. The porous layer may have a density at the surface thereof that is up to 90% less than the density of the body of the template substrate.

Figure 3:
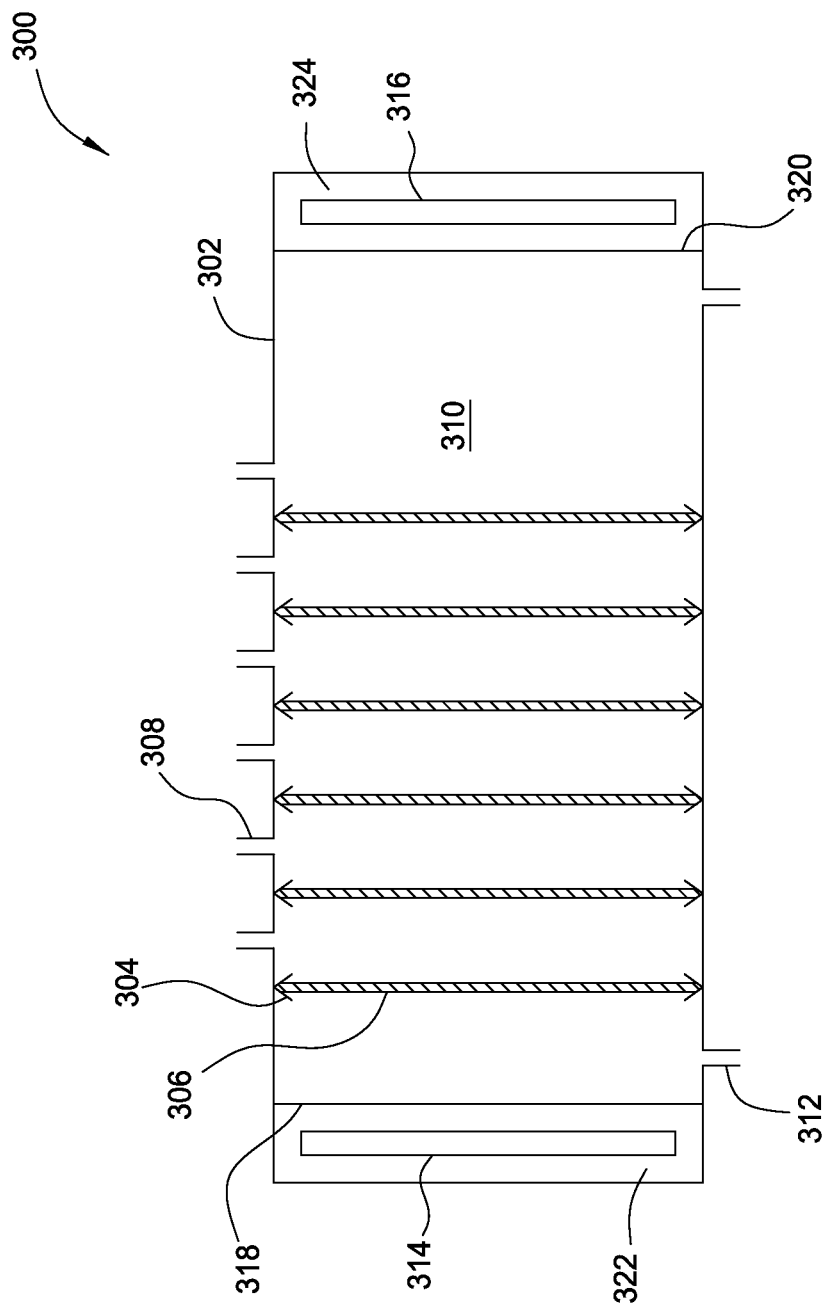
FIG. 3 is a schematic side view of an apparatus for practicing the method of FIG. 2.

FIG. 3 is a schematic side view of an apparatus 300 for forming porous layers according to the method 200. The apparatus 300 is a batch apparatus that may process any desired number of substrate concurrently. In the arrangement of FIG. 3, a plurality of substrates 306 are disposed in a reactor 302. The substrates 306 are oriented substantially parallel with respect to one another and may be vertical, horizontal, or at any orientation between vertical and horizontal. An electrode is disposed at either end of the reactor 302. Substrates 306 are held in place by clamps 304. Although six substrates are shown in FIG. 3, reconfiguration to accommodate any number of substrates is readily done by increasing the size of the reactor 302 and the number of clamps 304. The maximum number of substrates that can be processed concurrently is based on the acceptable size of the reactor 302 for optimal desired foot print, chemical utilization, required electric power, etc. Processing multiple substrates concurrently promotes low cost and high throughput, by allowing sharing of a chemical electrolyte bath, use of a single pair of electrodes and reduction in overall materials/components required for processing.

The electrode assembly includes two electrodes 314, 316 disposed at either end of the reactor 302. Each electrode 314, 316 may be a solid electrode plate or a film. The electrodes are typically formed from a material that is inert to the process chemistry. In the case of an HF/IPA solution, each electrode may be diamond, graphite, platinum, or any other suitable material, to avoid corrosion or etch during the electrochemical reaction. The electrode assembly may further comprise an electrode chamber 322, 324 for each electrode 314, 316, respectively. In this case, the electrode chambers 322, 324 are separated from a reaction chamber 310, which holds the actual process electrolyte and the substrates 306. Each electrode chamber 322, 324 may be separated from the process chamber 310 by the means of a conducting membrane 318, 320, which allows an electric field to pass through but prevents the transfer of chemical ions and molecules. each membrane 318, 320 may be self-standing or may be sandwiched between two perforated non-conducting plates to provide mechanical stability. This separation or compartmentalization allows for the use of different electrolyte chemicals (various compositions, chemical components, etc.) in the electrode chambers and the process chambers without interfering with each other.

The process chamber 310 holds the substrates 306 and the electrolyte. The substrates may have various geometries such as, but not limited to round, square, pseudo square (square with truncated corners) with rounder corners of varying degrees, as well as rectangular structures. The substrates may be essentially flat with varying degree of roughness or may be structured to form 3-dimensional patterns or structured with films that locally inhibit or enable porous silicon formation.

The clamps 304 may be continuous or discontinuous around the outer wall of the chamber 302. Continuous clamping of substrates 306 around the perimeter thereof may prevent channeling of ions around substrates, effectively sealing individual compartments between the substrates 306. In such an embodiment, the chamber 302 may have a cross-sectional shape that follows the shape of the substrates 306 to be processed therein, so the clamps 304 may be disposed on the outer wall of the chamber 302. Alternately, the clamps 304 may be supported from the walls of the chamber 302, for example by baffles that connect the clamps 304 to the wall of the chamber 302, to provide continuous contact with the substrates 306. In such embodiments, the chamber 302 is typically configured to open in one or more sections like a clam shell so that substrates 306 may be inserted in registration with the clamps 304. When the substrate 306 are inserted in one part of the chamber 302, the chamber 302 is closed, and the clamps 304 close around the substrates 306 establishing the seal.

The walls of the chamber 302 may be lined with a chemically inert material to prevent undesired leakage of electrolyte or electric field. The liner material may be a single layer or multiple layers. In the case of an HF/IPA electrolyte, the liner material is resistant to any reactions with HF or alcohol. The liner material may be an insulating rubber or foam to provide a leak-free seal between the substrate edge and the chamber wall or clamps.

The apparatus 300 with the compartmentalized electrode chambers 322, 324 allows for electric modulation as well. Parameters such as electrode dimension, distance between electrode and closest substrate, and distance between substrates, may be selected or modified to achieve a desired uniformity for the electric field. Spacers used to hold the membranes 318, 320 discussed above may also be modified, for example by changing shape or materials, to achieve a desired electric field uniformity. In circumstances where a varying electric field (thereby varying thickness or porosity of porous silicon) is desired for the integrated process flow, the spacer design can be used to control the electric field without changing the chamber design.

The chamber may have one or more fluid inlet ports 308 and fluid outlet ports 312 formed through a wall of the chamber 302. The fluid inlet ports 308 and fluid outlet ports 312 allow replenishment of electrolyte and removal of reaction byproducts to maintain consistent chemical composition in the chamber 302.

Hydrogen may evolve from the surface of the substrates 306 and the electrodes 314, 316, during the reaction. Since the bath is integral with electrical current transmission, hydrogen gas may block current flow and supply of chemicals to the reaction surface, thus affecting continuity and uniformity of porous silicon formation. Distance between substrates, fluid flow, and design of the flow ports determine the effectiveness of hydrogen gas removal. While removing hydrogen is fairly simple in terms of fluid mechanics, some consideration is warranted to mitigate electrical current loss through the fluid ports. Current loss may be mitigated by electrically isolating each port, by reducing diameter of the fluid delivery lines connected to the fluid ports, and/or by increasing the length of the fluid delivery lines. Reducing diameter and increasing length of the fluid delivery lines results in greater electrical resistance which reduces current losses. The current field lines are also influenced by the geometry adjacent to the substrate. So, large flow ports are less desirable compared to multiple small ports.

In some embodiments, the chamber 302 of FIG. 3 may be used as a substrate holder, and immersed in a bath of electrolyte contained in a larger container. The electrolyte may enter into the chamber 302 through any of the ports 308, 312 from the bath, and the electrodes 314, 316 may then be energized. In this way, multiple substrate holders may be cycled into the electrolyte bath to process substrates.

The apparatus 300 of FIG. 3 can be used to form either single-layer or multi-layer porous silicon on one or both sides of the substrates in the batch. Porous silicon may be formed on only one side of the substrates by applying the electrical current flowing in only one direction without a change in the current polarity. On the other hand, porous silicon can be formed on both sides of the substrates by alternating the current flow direction at least once or multiple times. The electrical current density (in conjunction with the HF concentration) controls the layer porosity. Thus, the layer porosity can be increased by increasing the electrical current density and conversely can be reduced by reducing the electrical current density. Multi-layer porous silicon can be formed by modulating or changing the electrical current level in time during the porous silicon formation process. For instance, starting the porous silicon process with a lower current density followed by a higher current density may result in formation of a lower porosity layer buried under a higher porosity layer. A graded porosity porous silicon layer can be formed by, for instance, linearly modulating or varying the electrical current density in time. One can use this approach to form any porous silicon structure with 1 to many porous silicon layers with 1 to many porosity values.

Figure 4:
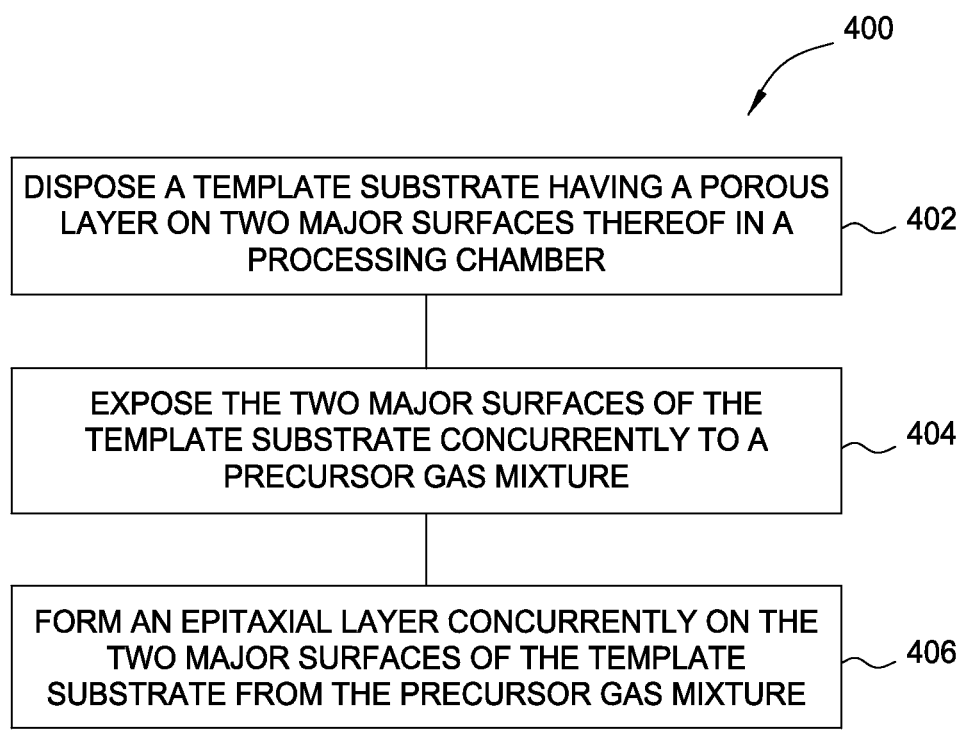
FIG. 4 is a flow diagram summarizing an epitaxy method according to another embodiment.

FIG. 4 is a flow diagram summarizing an epitaxy method 400 according to another embodiment. At 402, a template substrate having a porous layer on two major surfaces thereof is disposed in a processing chamber. The porous layers may be formed using the apparatus 300 in the method 200, and the template substrate may be crystalline silicon, germanium, silicon-germanium, silicon-carbon, silicon carbide, germanium-carbon, germanium carbide, silicon-germanium-carbon, silicon-germanium carbide, or a compound semiconductor such as a III/V, II/VI, III/IV/V, or II/IV/VI compound. As described above, the porous layers may be formed to have constant porosity and/or density, or a graded porosity and/or density. The porous layers may have the same thickness, which may be constant for a porous layer, or different thicknesses. The processing chamber may be any chamber useful for performing a CVD process, such as an epitaxy process.

At 404, the two major surfaces of the template substrate are exposed concurrently to a precursor gas. The gas is provided to the processing chamber containing the template substrate and flows to contact the two major surfaces of the template substrate. The template substrate may be rotated during the gas exposure. Portions of the template substrate may be masked prior to exposure to the precursor gas, if desired, to adjust a pattern of deposition on one or both major surfaces of the template substrate. The mask may be a shaped plate placed in contact with the porous surface or spaced apart from the porous surface of the template substrate. The mask may alternately be a layer deposited on the porous surface and patterned.

At 406, an epitaxial layer is formed concurrently on the two major surfaces of the template substrate from the precursor gas mixture. The substrate is typically heated to a processing temperature to form the layers. The heat may be generated external to the chamber and radiated into the chamber. Alternately, the heat may be generated inside the chamber. Because both major surfaces of the template substrate are exposed to the precursor gas concurrently, the layers grow epitaxially on both major surfaces of the template substrate concurrently.

Figure 5A:
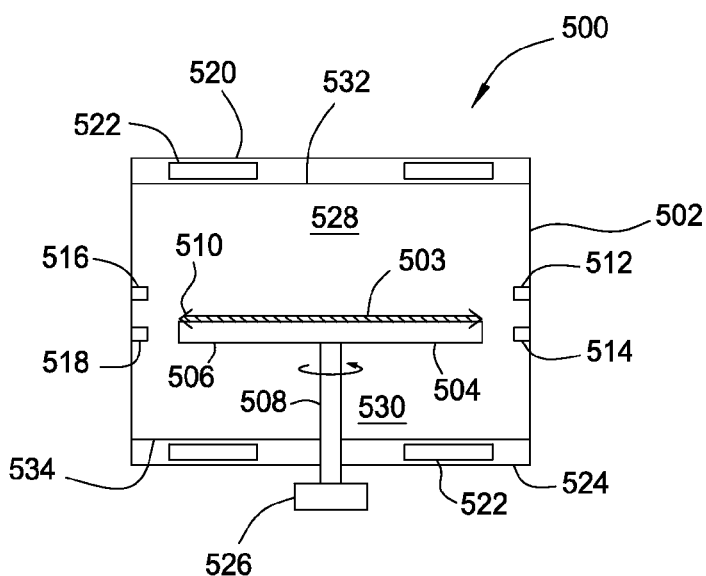
FIGS. 5A and 5C are schematic side views of two embodiments of epitaxy apparatus that may be used to perform the method of FIG. 4.

FIG. 5A is a schematic side view of an apparatus 500 for performing the method 400 according to another embodiment. The apparatus 500 includes an enclosure 502 enclosing a processing volume. A substrate support 504 is disposed in the processing volume and defines an upper processing volume 528 and a lower processing volume 530. The substrate support 504 has one or more edge grippers 510 for holding a template substrate 503 at an edge thereof. The edge grippers 510 are supported on arms 506 that extend from a spindle 508. The spindle 508 is coupled through a wall of the chamber 502 to a rotational actuator 526 that may be used to rotate the substrate support 504 and the template substrate 503. The substrate support 504 may be made of a heat resistant material, such as quartz. Typically a material is chosen that is substantially transparent to a heating radiation selected to heat the template substrate to avoid creating thermal non-uniformities.

In the embodiment of FIG. 5A, four arms 506 are provided, of which three are visible. Any convenient number of arms 506 may be provided. For example three or five arms 506 may be provided. In the case of a discontinuous edge gripper, each arm may have an edge gripper as an end effector.

In one embodiment, a single edge gripper 510 is used, and is continuous around a circumference of the substrate. A continuous edge gripper 510 may be applied to the substrate 503 outside the processing chamber 500, and may be transported into the processing chamber 500 with the substrate. Under such circumstances, the edge gripper 510 may have alignment features, such as indentations or grooves, on an underside of the edge gripper 510 for mating with the arms 506.

A precursor gas mixture may be provided through one or more gas inlet ports 516, 518. In the apparatus 500, two gas inlet ports are used, each gas inlet port directing precursor gases to flow across a major surface of the template substrate 503. The gas inlet port 516 directs the precursor gas mixture to flow across a first major surface of the substrate 503, and the gas inlet port 518 directs the precursor gas mixture to flow across a second major surface of the substrate 503 opposite the first major surface of the substrate. The precursor gas mixture provided by the gas inlet ports 516, 518 flows across the two major surface of the template substrate 503 and exits through gas exit portals 512, 514, respectively.

Heat may be provided for the apparatus 500 using an upper thermal source 520 and a lower thermal source 524. Each of the upper and lower thermal sources includes radiant emitters 522 that emit radiant energy into the upper and lower process volumes 528, 530, respectively. The radiant energy heats the template substrate 503 and the process gas mixture to energize the deposition reaction at the surface of the substrate 503. Because the substrate 503 is supported at an edge thereof, the radiant energy may directly illuminate the surface of the substrate 503 facing the lower process volume 530. Each of the thermal sources 520, 524 has a window 532, 534, respectively, that shields the emitters 522 from the process environment so that the emitters 522 are not exposed to process gases in the processing volumes 528, 530.

Figure 5B:
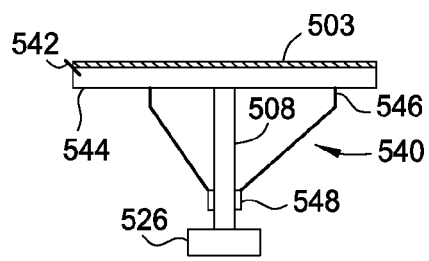
FIG. 5B is a schematic cross-sectional view of an alternative substrate support assembly that may be used in the apparatus of FIG. 5A.

FIG. 5B is a schematic cross-sectional view of a substrate support assembly 540 that may be used in the apparatus 500 as an alternative to the substrate support 504. In the assembly 540, the substrate 503 is supported on an edge support 542 that contacts the substrate 503 at an oblique angle to minimize surface contact with the substrate 503. The edge support 542 is supported from arms 544, which may be the same as the arms 506 of the apparatus 500. The arms 544 extend from the spindle 508, which is coupled to the rotational actuator 526. A plurality of lift pins 546 are coupled to a lift pin collar 548, that may be actuated or may be deployed by contact with a bottom wall of the chamber 502, as is conventionally known. The substrate support assembly of FIG. 5B offers advantages in installing and retrieving the template substrate 503 from the chamber because the edge support 542 is not closed from above. A substrate handling robot may deposit a substrate on the lift pins 546 when the lift pins 546 are deployed and extend above the edge support 542. The spindle 508, arms 544, and edge support 542 may then be moved upward to engage the substrate 503, lifting the substrate 503 into processing position above the lift pins 546, as shown in FIG. 5B. A reverse process may be used to retrieve the substrate 503.

Figure 5C:
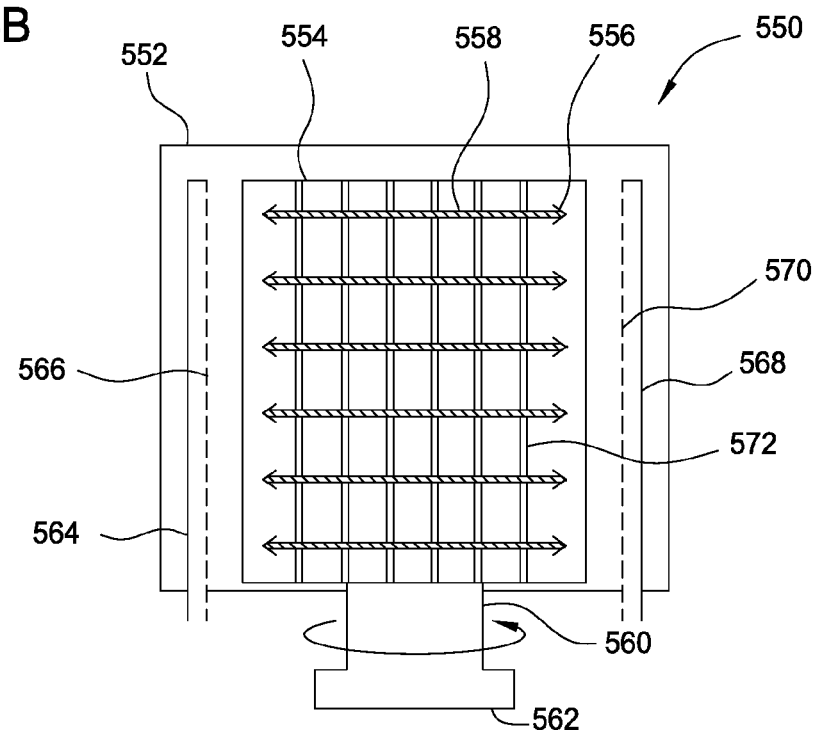

FIG. 5C is a schematic side view of a batch processing chamber 550 for forming epitaxial layers on template substrates according to another embodiment. A chamber 552 has a plurality of edge supports 556 coupled to a frame 554, which is coupled to a rotational acuator 562 by a stem 560. A gas inlet 564 provides a precursor gas mixture to the chamber 552. Substrates 558 may be loaded into the edge support 556 of the frame 554 outside the chamber 552, and the frame may then be moved into the chamber 552 for processing. Openings 566 in the gas inlet 564 flow the precursor gas mixture along two major surfaces of each substrate 558 to perform a deposition process. Gas exits the chamber 552 through a gas outlet 568, which has openings 570 for collecting gas flowing across the substrates Heating elements 572 are visible behind the frame 554. The heating elements 572 provide radiant energy into the chamber 552 for energizing the deposition process. The heating elements 572 may be any radiant heating elements, such as infrared emitting elements or visible light emitting elements, or a combination thereof. In one embodiment, the heating elements 572 are resistive heating elements in which an electric current generates resistive heat.

Figure 6:
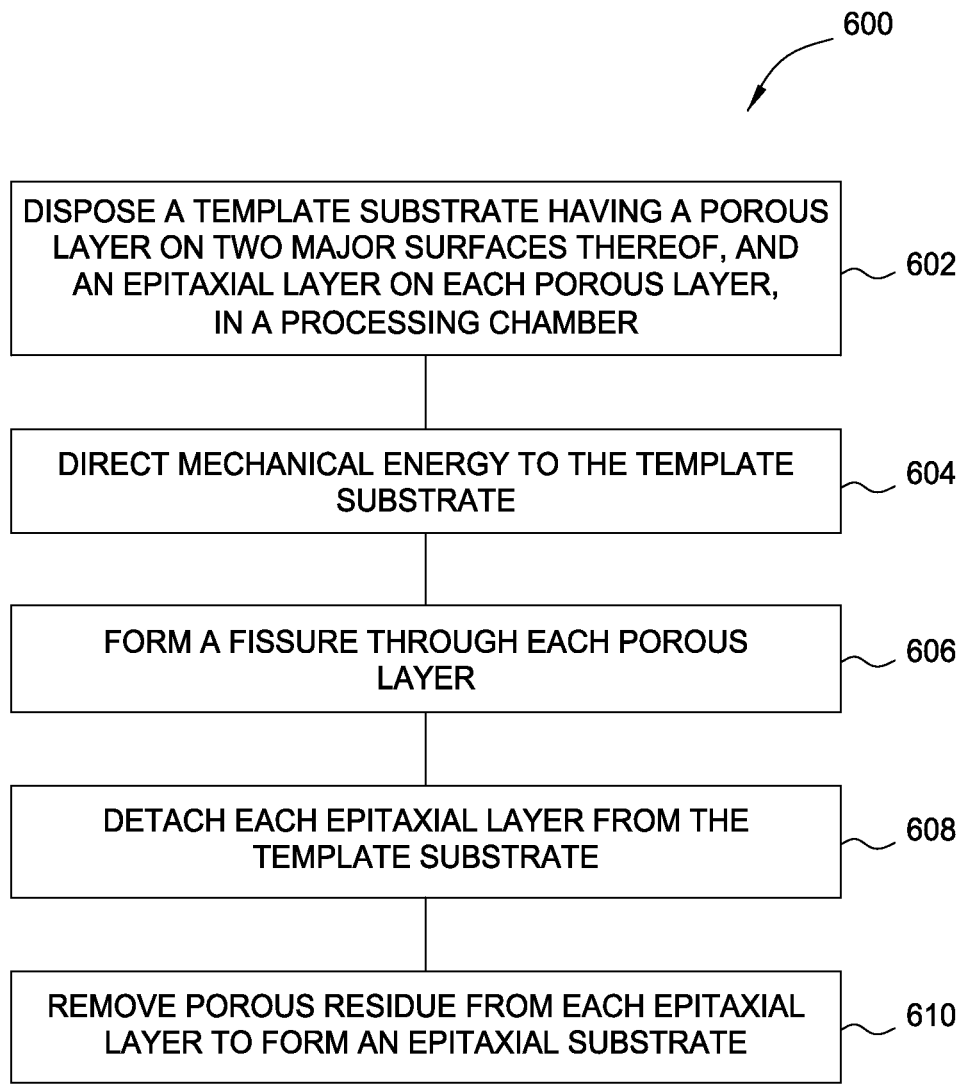
FIG. 6 is a flow diagram summarizing a method of obtaining substrates according to another embodiment.

FIG. 6 is a flow diagram summarizing a method 600 according to another embodiment. At 602, a template substrate having a porous layer formed on two major surfaces thereof, and an epitaxial layer formed on each porous layer, is disposed in a processing chamber. Such a template substrate may be made using any of the foregoing apparatus and methods. The processing chamber may be fluid bath chamber in some embodiments.

At 604, mechanical energy is directed to the template substrate through the epitaxial layers. The mechanical energy is selected to preferentially stress the porous layers and cause fracturing of the porous layers. The mechanical energy may be acoustic energy or contact mediated mechanical energy. In an embodiment wherein the mechanical energy is contact mediated mechanical energy, an actuator contacts one or more of the epitaxial layers and vibrates or engages in an oscillating motion to stress the porous layer under the epitaxial layer. In an embodiment wherein the mechanical energy is acoustic energy, the template substrate may be immersed in an acoustically transmissive medium to facilitate directing acoustic energy to the substrate.

In an acoustic embodiment, a transducer generates pressure waves that propagate to the substrate and cause pressure waves to propagate through the layers of the template substrate. The frequency and amplitude of the pressure waves may be subsonic, sonic, or ultrasonic, and may be selected to maximize efficiency of coupling with the porous material of the substrate. Frequency of the pressure waves may be between about 5 kHz and about 2,000 kHz, such as between about 20 kHz and about 1,000 kHz, for example about 26 kHz or about 950 kHz. The frequency of the pressure waves may be varied in a single treatment. For example, one template substrate may be subjected to pressure waves that have varying frequency between about 20 kHz and about 1,000 kHz. Frequency of the pressure waves may be repeatedly increased and lowered to couple with different vibrational modes of the substrate material for efficient processing. Amplitude of the pressure waves may be selected to provide incident power at the template substrate between about 300 W and about 2,000 W, for example about 600 W.

Acoustic or contact mechanical stress may be applied to both major surfaces of a template substrate concurrently or sequentially. In applying acoustic mechanical energy to both major surfaces of a template substrate concurrently, a pressure wave generating transducer may be disposed facing each major surface of the template substrate, so that two pressure wave generating transducers are used. Each transducer may generate pressure waves that concurrently impact the substrate. The two transducers may generate pressure waves having the same frequency and power, so that the wavefields generated by the two transducers are substantially the same or synchronous, or the two transducers may generate different wavefields that may be asynchronous. The pattern of wavefields generated by the two transducers may be selected to maximize efficiency of coupling the two wavefields into the two porous layers. In apply acoustic mechanical energy sequentially, one transducer may be used, and the template substrate flipped to allow processing of both major surfaces sequentially, or two transducers may be used and energized sequentially so the two transducers are not producing pressure waves at the same time. The two transducers may be operated in block fashion, such that processing with a first transducer is complete before a second transducer is energized, or the two transducers may be operated in alternating fashion. Each transducer may include a detector so that if a first transducer is producing pressure waves, a second transducer may be used to detect the pressure waves and control frequency and power thereof.

The porous layers described herein for facilitating manufacture of epitaxial layers may be formed using the method 200 and/or the apparatus 300. Porosity of the layers is generally between about 5% and about 95%. In an embodiment with a single porous layer on a template substrate, porosity of the layer may be between about 20% and about 80%, such as between about 30% and about 70%, for example about 50% or 60%. Porosity of the porous layer may be selected to provide a desired fracturing behavior when subjected to a defined stress pattern. In an embodiment in which two porous layers are formed on each side of a template substrate, a first porous layer may have a porosity between about 5% and about 25% while a second porous layer formed over the first porous layer may have a porosity between about 50% and about 80%.

In the contact mediated case, two actuators may be applied to the two major surfaces of the template substrate concurrently, or a single actuator may be applied to a first major surface of the template substrate while a static holder is applied to the second major surface. If two actuators are used, the two actuators may be energized concurrently such that mechanical stress is applied to both major surfaces of the template substrate concurrently. Alternately, the two actuators may be energized sequentially in block fashion or alternating fashion, as described above with the acoustic transducers. Because the contact actuators are typically capable of generating much higher amplitudes of mechanical stress than the pressure wave transducers, a lower frequency may be used with the contact actuators to apply a given power to the substrate. As with the pressure wave transducers, the contact actuators may cycle at a frequency from about 1 Hz to about 100 Hz, for example about 10 Hz, which may vary during processing. As with the acoustic case, the frequency pattern may vary synchronously or asynchronously between two actuators.

At 606, a fissure is formed through each of the porous layers. The fissure is formed by application of the mechanical energy to the substrate in such a way that the porous material on each major surface of the template substrate develops fractures. A fissure may be continuous through a porous layer, or a number of discontinuous fissures may develop. In the event a continuous fissure develops, the epitaxial layer may be cleaved from the porous layer. If a continuous fissure does not develop, the discontinuous fissures may be exploited to cleave the epitaxial layer from the porous layer by applying a moderate separating force. For example, a static holder may be applied to the epitaxial layer and a separating force established on the epitaxial layer. Then mechanical energy of the kinds described above may be directed to the substrate while the separating force is also applied to the substrate. The separating force may reduce the quantity of mechanical energy needed to cleave the epitaxial layer from the template substrate. Thus, the mechanical energy applied to the template substrate may be a combination of a fixed component and a varying component.

At 608, each epitaxial layer is detached from the template substrate. The epitaxial layers are generally detached by attaching a substrate holder to each epitaxial layer and removing the layer. The template substrate may be stabilized by one of the holders attached to an epitaxial layer while the other epitaxial layer is removed. In such an embodiment, one epitaxial layer may be removed to a staging or processing location, and the substrate holder used to remove the epitaxial layer may be reattached to the template substrate to stabilize the substrate while the second epitaxial layer is removed. Alternately, the template substrate may be stabilized by an edge gripper while both epitaxial layers are removed.

At 610, any porous residue is removed from each epitaxial layer to form an epitaxial substrate. The porous residue may be removed by chemical means, physical means, or a combination thereof. The porous material may be removed by planarization and/or chemical treatment, such as exposure to hydrogen plasma.

Figure 7A:
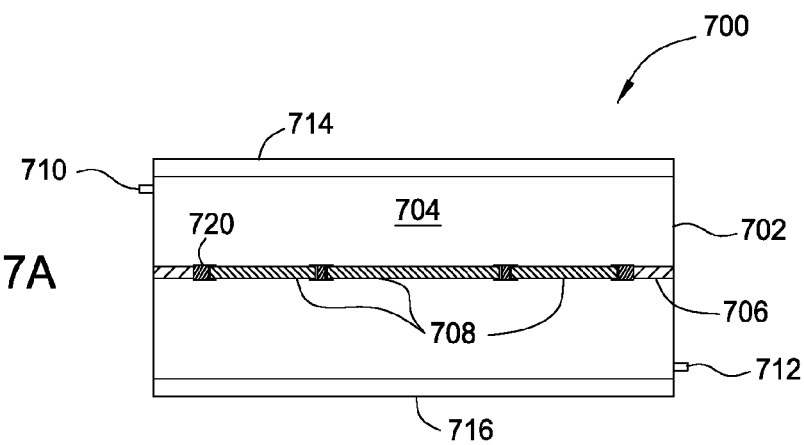
FIGS. 7A-7D are schematic side views of four embodiments of separation apparatus that may be used to perform the method of FIG. 6.

FIG. 7A is a schematic cross-sectional view of a separation apparatus 700 for performing the method of FIG. 6 according to one embodiment. The apparatus 700 features a chamber 702 that encloses a processing volume 704 in which one or more substrates 708 is disposed for processing. Three substrates 708 are visible in the view of FIG. 7A, but any number of substrates may be processed in the apparatus 700 by scaling the apparatus to fit the number and size of substrates to be concurrently processed. The substrates 708 may be held by a susceptor 720, and the susceptor 720 may be supported by an edge support 706, which may be attached to opposite walls of the chamber 702.

A first pressure wave transducer 714 is disposed facing a first side of the substrates 708, and a second pressure wave transducer 716 is disposed facing a second side of the substrate 708 opposite the first side. The pressure wave transducers 714, 716 produce pressure waves, for example sound or other acoustic wavefields, within the chamber 702. The transducers direct the pressure waves toward the substrates 703 supported by the susceptor 720. The chamber 702 may be filled with a fluid selected to be highly transmissive of pressure waves generated by the transducers 714, 716. The transducers 714, 716 are generally capable of generating pressure waves having frequency between about 1 kHz and about 2,000 kHz at power levels between about 1 W and about 2,000 W. Fluid may be provided to the chamber 702 through a fluid inlet 710 and removed from the chamber through a fluid outlet 712. In one embodiment, the transducer 714 is removable so that a susceptor with substrates may be disposed on, and removed from, the edge support 706. In another embodiment, the transducer 714 is movable, for example hinged, to allow access into the chamber 702.

In some embodiments, the fluid for transmitting pressure waves may include a cleaving aid such as an etchant. The etchant may be present in a low concentration that is sufficient to speed development of fissures in the porous material. One example of such a fluid is a low-strength solution of HF in water or alcohol. The fluid itself transmits the pressure waves efficiently to the substrate, and the HF may act as an etchant to speed cleaving of the epitaxial layers from the porous layers.

Figure 7B:
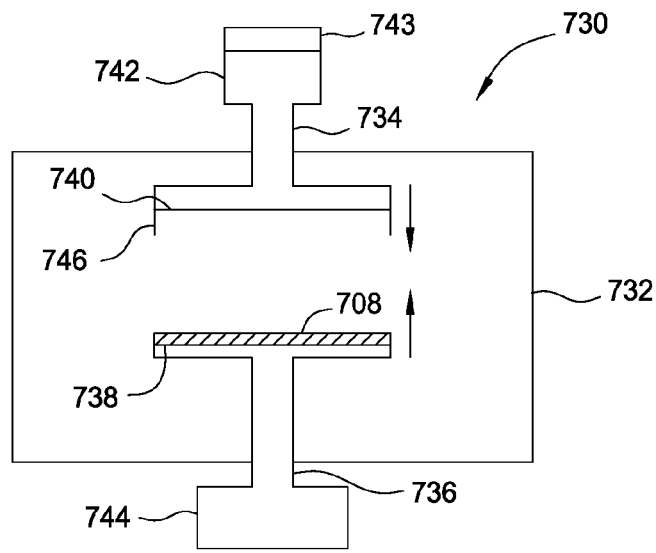

FIG. 7B is a schematic side view of a separation apparatus 730 according to another embodiment. The method of FIG. 6 may be performed using the apparatus 730. A chamber 732 encloses a substrate support 736, with an actuator 744 that moves the substrate support 736 in a direction parallel to an axis thereof. A substrate 738 may be disposed on a substrate supporting surface of the substrate support 736.

A contact actuator 734 is disposed opposite the substrate support 736. The contact actuator 734 has a contact surface 740 that contacts a surface of the substrate 738. The contact surface 740 may apply a holding force to the substrate 738, such as vacuum or an electrostatic force. A source 742 of holding force provides the holding force to the contact surface 740. The source 742 may be a vacuum source or a power supply to provide electrostatic holding force.

The contact actuator 734 may also have a shield 746 that extends from a periphery of the contact actuator 734. The shield 746 may engage the support surface of the substrate support 736 when the contact surface 740 makes contact with the substrate 738 to facilitate maintenance of vacuum around the contact surface 740, for contact actuators that work by applying vacuum to the substrate. The shield 746 surrounds the substrate 738 on all sides with a gap between the shield and the supporting surface, and the substrate 738, that controls gas flow to the contact surface 740 at a rate less than the capacity of the source 742 to maintain vacuum.

A mechanical stress source 743 is coupled to the contact actuator 734 to transmit mechanical stress through the contact actuator 734 to the substrate 708. The mechanical stress source 743 may be a vacuum cycler that cycles the source 742 to vary application of vacuum to the contact surface 740. Alternately, the mechanical stress source 743 may be a piezoelectric actuator or a capacitive force actuator that can be rapidly cycled to produce a varying and/or cyclical mechanical stress at a broad range of frequencies.

Figure 7C:
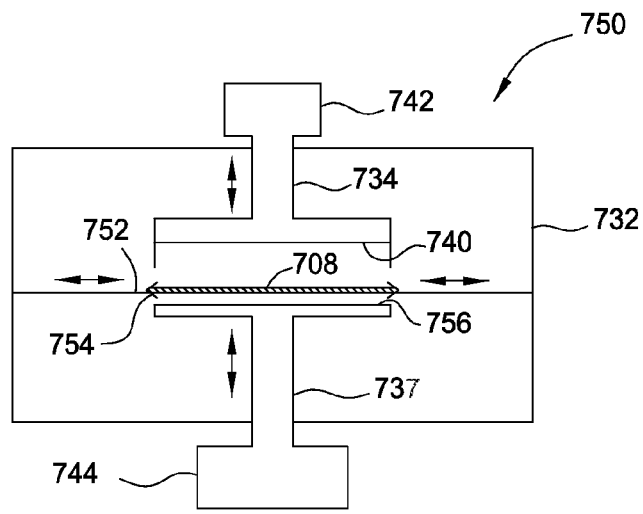

FIG. 7C is a schematic side view of a separation apparatus 750 according to another embodiment. The method of FIG. 6 may be performed using the separation apparatus 750. The chamber 732 encloses a first contact actuator 734 and a second contact actuator 737, each with a contact surface 740 and 756, respectively. Each of the contact surfaces 740 and 756 may be vacuum membranes, as described above. The substrate 708 is supported using an edge support 754 that may be supported from the walls of the chamber 732 by a wall support 752. The wall support 752 may be actuated to move in a lateral direction. The edge support 754 may separate into a plurality of pieces as the wall support 752 retracts so that the substrate 708 disengages from the edge support 754. A substrate handling robot (not shown) may be inserted into the chamber 732 to a position below the substrate 708 in engagement therewith. As the edge support 754 is retracted, the substrate 708 may then rest on the substrate handling robot for removal from the chamber 732 through a slit valve or similar commonly used means. The vacuum surfaces 740 and 756 are coupled to respective vacuum sources 742 and 744, and the contact actuators 734 and 737 may be coupled to linear actuators to move the contact actuators 734, 737 along their axes.

Alternately, the edge support 754 may be a plurality of arms extending from the side of the chamber to engage the edge of the substrate 708. Each arm may have an end effector with v-shaped profile, a u-shaped profile, or any convenient profile for engaging the edge of the substrate 708. The arms may be retracted to release the substrate for removal from the chamber, or extended to engage and hold the substrate for processing.

The contact actuators described herein may employ a cyclical motion to facilitate separation of the epitaxial layer from the porous layer. A cyclical pulling force may be applied to the contact actuator to apply a repetitive stress to the substrate. The amplitude and frequency of the repetitive stress may be selected to fatigue and fracture the porous layer preferentially.

Figure 7D:
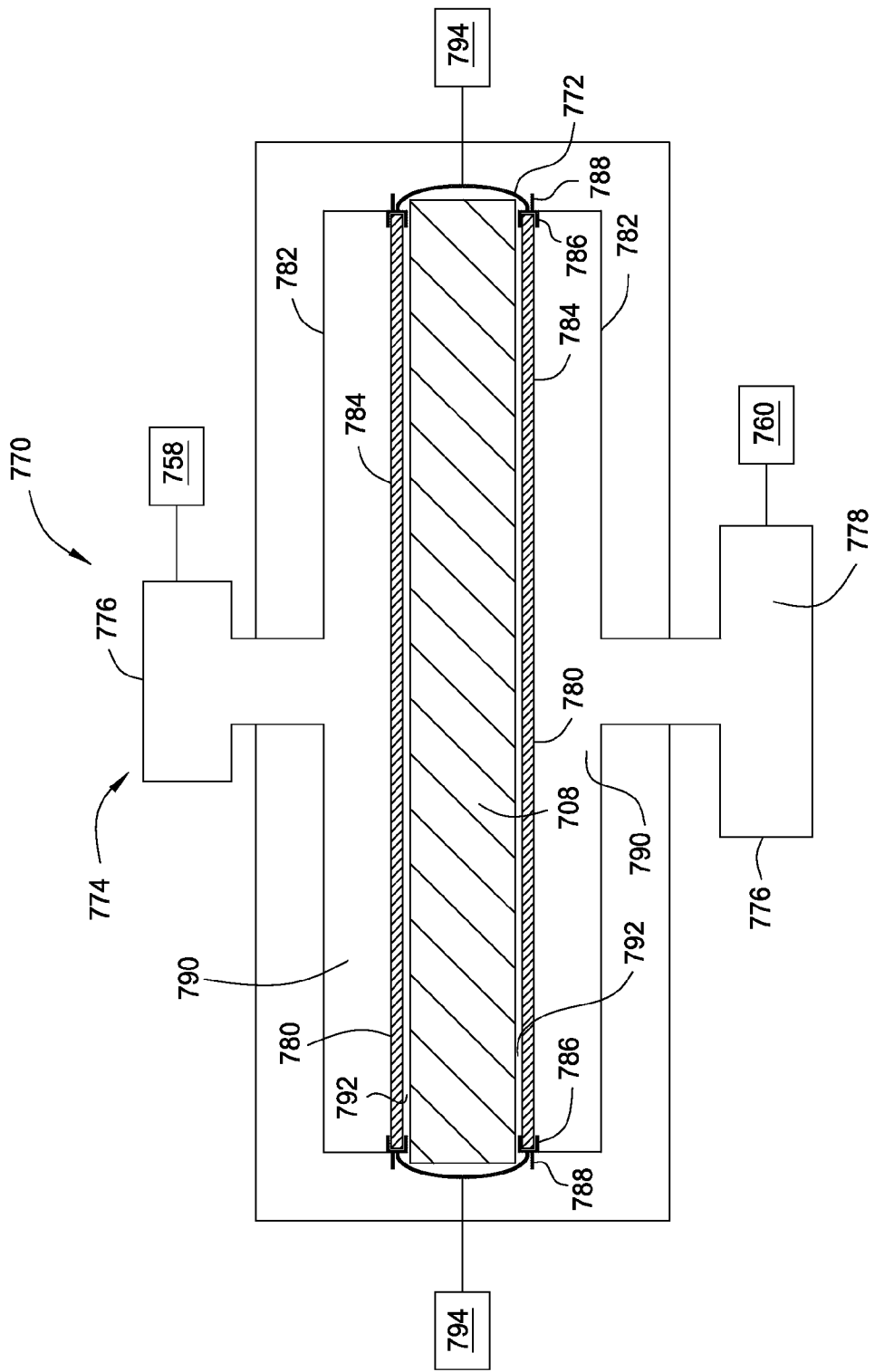

FIG. 7D is a schematic cross-sectional view of a separation apparatus 770 according to another embodiment. The separation apparatus 770 is similar to the separation apparatus 750 of FIG. 7C in many respects. Most notably, the substrate 708 is supported by an edge support 772 and both major surfaces of the substrate 708 are processed concurrently or sequentially. A first separation actuator 774 processes a first side of the substrate 708 and a second separation actuator 776 processes a second side of the substrate 708. With the exception of processing opposite sides of the substrate, the two separation actuators 774/776 are substantially identical in major respects.

Each of the separation actuators 774/776 has a vacuum head 782 coupled to a vacuum source 776. The vacuum head 782 has a vacuum applicator 784 that is held in a recess 786 of the vacuum head 782. An edge of the vacuum applicator 784 is disposed in the recess 786 around the circumference of the vacuum applicator 784. The recess 786 forms a vacuum seal with the vacuum applicator 784, and defines a vacuum plenum 790 opposite the vacuum applicator 784 from the substrate 708. The vacuum applicator 784 may be a porous member, for example made from a porous ceramic material, to allow uniform application of vacuum.

The vacuum head 782 may include a stop 788 that extends laterally, or radially, away from the recess 786. The recess 786 opens inward toward a central region of the chamber 770 to allow engagement with the edge of the vacuum applicator 784 around its circumference. The stop 788 extends from an opposite side of a wall of the recess 786. The stop 788 may be positioned to engage with the edge support 772 at an inner edge 796 thereof, above the substrate 708, to define a gap 792 between the vacuum applicator 784 and the substrate 708. The gap 792 prevents contact with the surface of the substrate 708, which may have a thin epitaxial layer formed thereon, and allows maintenance of a vacuum over the surface of the substrate 708. Gas flows across the substrate surface through the gap 792, through the vacuum applicator 784 into the vacuum plenum 790 and out through an exhaust (not shown) of the vacuum source 776. Clearance between the substrate 708 and the vacuum applicator 784 is typically about 100 µm or less. Use of a non-contact vacuum head such as the vacuum head 782 allows for detachment of the epitaxial layers from the substrate 708 using minimal force. Once detached the epitaxial layer adheres by suction to the vacuum head and may be transported for subsequent processing.

A cyclical or varying force may be applied to the substrate using the vacuum heads 782 of the apparatus 770. The vacuum pressure may be pulsed according to a desired frequency and/or pattern, and/or the vacuum heads 782 may be actuated in an axial direction to vary the force. The vacuum heads 782 may be actuated by linear actuators 758/760, respectively, which may be any convenient type of linear actuator. The linear actuators 758/760 may also be used to move the vacuum heads 782 away from the substrate 708 for entry and exit of the substrate 708 from the chamber 770. One or more actuators 794 may also be coupled to the edge support 772 to engage and disengage the edge support 772 with the edge of the substrate 708.

Although a single substrate is shown for simplicity in the chamber 770, the chamber 770 may be configured to process a plurality of substrates concurrently. The substrates may be disposed in a susceptor with a plurality of laterally displaced substrate locations, for example like the susceptor 720 of FIG. 7A. The vacuum heads 782 may likewise have a plurality of vacuum applicators 784 to match the arrangement of substrates in the susceptor. The vacuum applicators 784 may share a common vacuum plenum 790 to balance loads on the substrates in the susceptor.

Figure 8A:
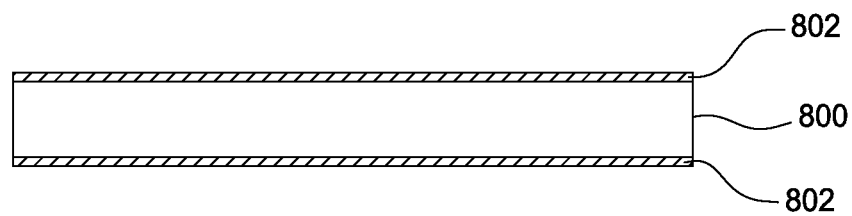
FIGS. 8A-8C are cross-sectional views of a substrate undergoing the methods of FIGS. 1, 2, and 4.
Figure 8B:
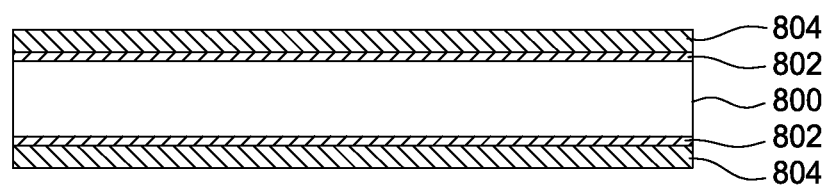
Figure 8C:
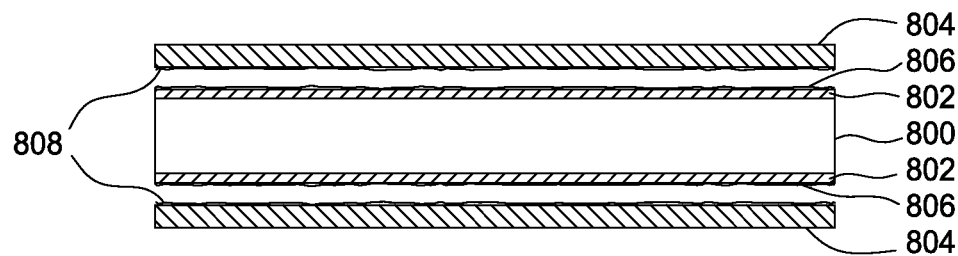

FIGS. 8A-8C are cross-sectional views of a substrate 800 at various stages of the methods 100, 200, 400, and 600. In FIG. 8A, the substrate 800 may be a template substrate, and the substrate 800 has a porous layer 802 formed on each major surface of the substrate 800. In FIG. 8B, an epitaxial layer 804 has been formed on both porous layers 802. In FIG. 8C, the epitaxial layers 804 have been separated from the porous layers 802. A thin remnant of porous material 808 remains on the epitaxial layers 804, and a roughened surface 806 of the porous layers 802 reveals the shape of the fissures through the porous layers 802 that resulted in separation of the epitaxial layers 804. As noted above, the porous remnant may be removed from the epitaxial layers through planarization or through chemical processes such as hydrogen plasma exposure.

FIGS. 9A-9F are cross-sectional views of a substrate 900 at various stages of the methods 100, 200, 400, and 600. In FIG. 9A, a first porous layer 902 is formed on at least two major surfaces of the substrate 900. The substrate 900 may be a template substrate. In FIG. 9B, a second porous layer 904 has been formed on the first porous layer 902, on both major surfaces of the substrate 900. Forming two porous layers on each surface of the substrate as in FIG. 9B may be useful in promoting separation at a desired location or layer. For example, the first and second porous layers 902, 904 may have different porosities. For example, the first porous layer 902 may be a high density, or low porosity layer and the second porous layer 904 may be a low density layer.

In FIG. 9C, a protective layer 906 has been applied to the substrate covering the epitaxial layers 904. The protective layer 906 may be provided to allow for contact handling of the epitaxial layers 904 without damaging the epitaxial layers 904. The protective layer 906 may be any material that can be conveniently applied and removed without substantially altering the epitaxial layers 904. Examples include tape, which may be applied using adhesive or melting, gel, wax, polymer, hardmask, glass, and ceramic, among others.

In FIG. 9D, the substrate has been subjected to a lateral separation process, such as a scribing or dicing process, to separate the epitaxial layers 904 and the protective layers 906 laterally from an edge portion 912 of the substrate so that the epitaxial layers 904 may be removed after separation from the porous layers 904. The separation process of FIG. 9D may be a mechanical scribing process, such as a sawing process, for example using a diamond saw or water jet, or the separation process of FIG. 9D may be a radiant scribing process, such as a laser scribing process. The lateral separation process of FIG. 9D produces openings 908 through the protective layers 906 and the epitaxial layers 904 that define a removal portion 910 of the protective layers 906 and the epitaxial layers 904. The openings 908 may be grooves, and a depth of the openings may be less than a combined thickness of the protective layer 906 and the epitaxial layer 904 to avoid any damage to the surface of the substrate 900. It should be noted that lateral separation may be employed without using a protective layer, if desired. For example, lateral separation as described above may be practiced in connection with the method 600 and may be applied to the substrate depicted in FIG. 8B before performing a separation to yield the substrate and epitaxial layers depicted in FIG. 8C.

In FIG. 9E, the removal portion 910 on a first major surface of the substrate 900 has been separated, the epitaxial layer 904 having been separated from the porous layer 902 on the first major surface. In FIG. 9F, the removal portion 910 on a second major surface of the substrate 900 has been similarly separated. The two removal portions 910 may be removed sequentially, as depicted in FIGS. 9E and 9F, or the two removal portions 910 may be removed concurrently. Methods of concurrent and sequential removal are described above in connection with the method 600. As also described in connection with the method 600, the porous layer 904 separated with the epitaxial layer 906 may be removed using mechanical means or chemical means. The porous layer 902 remaining on the substrate 900 may be removed, if desired, before recycling the substrate. Alternately, the substrate 900 may be recycled with the porous layer 902. For example, a template substrate with a low porosity layer formed on two major surfaces thereof may be subjected to a process of forming a porous layer, as described in connection with the method 200. By exposing the substrate to electrolyte for time sufficient to thicken the porous layers, the low porosity layer may be converted to a high porosity layer, and a new low porosity layer may be formed beneath the high porosity layer. A substrate prepared in this manner may then be subjected to the methods 400 and 600 to yield the results described in FIGS. 9A-9F. The low porosity layer 902 may have a porosity between about 5% and about 25%, while the high porosity layer 904 may have a porosity between about 50% and about 80%.

In the sequential separation case, as depicted in FIGS. 9A-9F, the porous layers 902, 904 on the two surfaces of the template substrate 900 may have different porosities, densities, and/or thicknesses to facilitate a sequential separation process. In FIG. 9E, a first low porosity layer 902A on a first side of the substrate 900 may have a higher porosity and a lower density that a second low porosity layer 902B on a second side of the substrate 900. The second low porosity layer 902B may also have a larger thickness than the first low porosity layer 902A. Thickness of the porous layers 902, 904 is generally between about 100 μm and about 1 mm.

For sequential separation, a contact actuator may be applied to the first side of the substrate while a static holder is applied to the second side of the substrate. The contact actuator may then be energized to apply mechanical stress to the first side of the substrate. If the porosity of the low porosity layer 902A, nearer to the contact actuator for the first separation, is higher than the porosity of the low porosity layer 902B, power input to the contact actuator may be selected for that fissuring will occur along the first side of the substrate 900 before fissuring occurs along the second side of the substrate 900. In this manner, the epitaxial layers 904 may be sequentially separated from the substrate 900.

After separating the first epitaxial layer 904 from the substrate 900, the contact actuator is de-energized and the separated epitaxial layer 904 removed, either by motion of the contact actuator or by applying a substrate handler to the separated epitaxial layer. A static holder may then be applied to the first side of the substrate 900, which no longer has an epitaxial layer, and a contact actuator may be applied to the second side of the substrate 900, which still has an epitaxial layer 904 formed thereon. The contact actuator may then be energized to apply mechanical stress to the second side of the substrate 900. Because the porosity of the low porosity layer 902B is lower than the porosity of the low porosity layer 902A, power input to the contact actuator may be higher when separating the epitaxial layer 904 from the second side of the substrate 900 than from the first side.

Figure 10A:
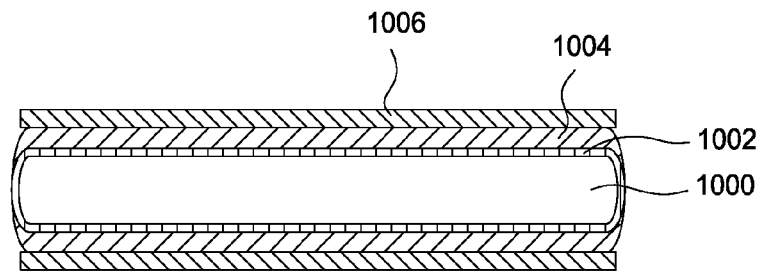
FIGS. 10A-10C are side views of a substrate undergoing variants of the method of FIG. 6.
Figure 10B:
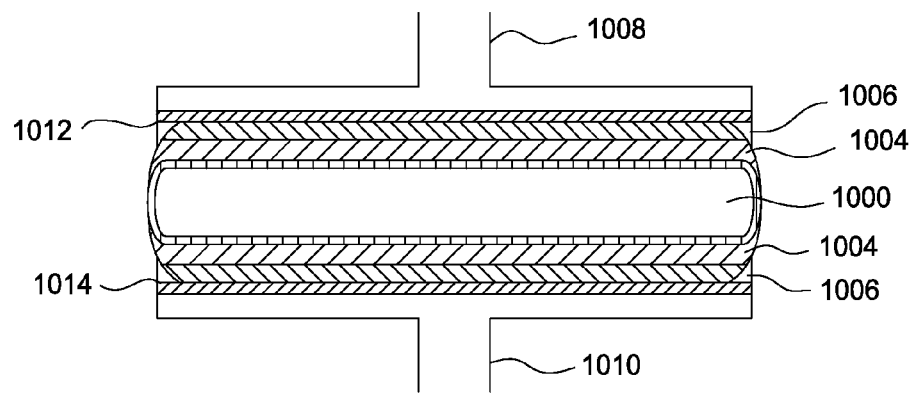
Figure 10C:
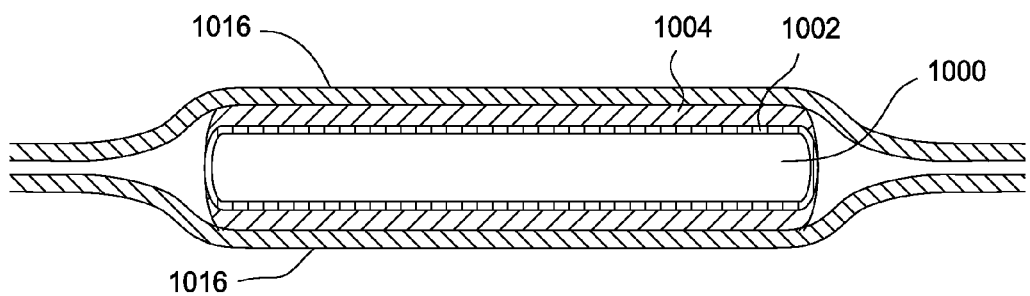

FIGS. 10A-10C are side views of a substrate undergoing separation processes according to another embodiment. In FIG. 10A, a substrate 1000 has a porous layer 1002 formed on at least two major surfaces of the substrate 1000, which may be a template substrate. An epitaxial layer 1004 is formed on the porous layers 1002. A protective layer 1006 is formed on the epitaxial layers 1004. The protective layer provides a contact surface for handling the epitaxial layers 1004 after separation from the substrate 1000. By using a protective layer such as the protective layer 1006, direct contact with the epitaxial layers 1004, and potential damage resulting from such contact, is minimized. The protective layer may be any material that is easily removed. A carbon-containing material, such as a polymeric or amorphous material, may be used in some cases. The protective layer 1006 may be deposited on, applied to, or adhered to the epitaxial layer 1004. The protective layer 1006 may be a tape material that may be applied using an adhesive or by melting all, or a portion, of the tape.

FIG. 10B is a side view of the substrate 1000 with the porous layers 1002, the epitaxial layers 1004, and the protective layers 1006 applied. Contact actuators 1008 and 1010 are deployed such that respective contact surfaces 1012, 1014 are in contact with the protective layers 1006. The substrate 1000 is thus prepared for mechanical separation of the epitaxial layers 1004 from the porous layers 1002 by application of mechanical stresses by the contact actuators. The protective layers 1006 provide a damage resistant handling surface for the epitaxial layers 1004 to be separated from the porous layers 1002 and then subsequently moved to other stations for further processing. The protective layers 1006 may be removed by mechanical or chemical means. In the tape embodiment, the protective layers 1006 may be peeled away from the epitaxial layers to leave epitaxial substrates. Heat may be applied to soften any adhesive and lessen the peeling force needed to remove the tape, if desired. Alternately, the protective layer may be etched using a selective chemistry.

FIG. 10C is a side view of the substrate 1000 in another processing embodiment featuring a continuous protective layer 1016 applied to both major surfaces of the substrate 1000 over the porous layers 1002 and the epitaxial layers 1004. The continuous protective layers 1016 may be a continuous tape with a plurality of template substrates sandwiched between two tape layers. In such an embodiment, a succession of template substrates may be processed by routing the tape through various processing stations.

FIG. 11A is a schematic side view of an apparatus 1100 for making epitaxial substrates according to one embodiment. The apparatus 1100 may benefit from the continuous protective layers shown in FIG. 10C. A template substrate 1102 having layers such as the porous layers and epitaxial layers described herein is positioned at a staging location 1104. A continuous protective layer 1106 is deployed along each major surface of the template substrate 1102 by dispensers 1108, which may be rollers, as indicated by arrows 1110. Once applied to the substrate 1102, the continuous protective layers 1106 additionally serve to transport the substrate 1102 through the various processing stages of the apparatus 1100. An applicator station 1112 may be used to join the continuous protective layer 1106 to both major surfaces of the substrate 1102, for example by pressing the continuous protective layer 1106 onto the substrate 1102. The applicator station 1112 may feature a squeegee type wafer laminator.

The thickness of the continuous protective layer 1106 may be between about 10 µm and about 2 mm. The continuous protective layer 1106 may be a material that is resistant to acids such as HF, and may be a UV-debondable tape featuring an adhesive that may be debonded by exposure to UV. The continuous protective layer 1106 may have adhesive on one or two sides thereof, such as the side facing the substrate 1102 and the side facing away from the substrate 1102. The continuous protective layers 1106 may be joined at the edges of the substrate 1102, effectively sealing the substrate 1102 from the environment until subsequent processing alters the continuous protective layers 1106.

The substrate 1102 may be transported to a lateral separation station 1114 by movement of the continuous protective layers 1106 enclosing the substrate 1102. The lateral separation station 1114 may have edge writers 1116 that define boundaries of the epitaxial substrates to be separated from the template substrate 1102. The edge writers may be mechanical or radiant, as described above. The substrate 1102 may then move to a layer separation station 1118. The layer separation station 1118 may have contact actuators 1120 that apply mechanical stresses to separate the epitaxial layers from the substrate 1102. A layer removal station 1122 may then remove the epitaxial layers separated from the substrate 1102. The layer removal station 1122 may be a multi-face rotating pickup tool 1124 disposed adjacent each side of the substrate 1102 such that successive faces of the pickup tool 1124 come into contact with successive substrates by rotation of the pickup tool 1124. A removal tool 1126 may be used to remove the substrates from the pickup tool 1124 for subsequent processing.

After separation and removal of epitaxial substrates from the template substrates 1102, the template substrate 1102 may be routed to a protective layer disengagement station 1128. The disengagement station 1128 may apply radiation, such as thermal radiation or UV, may contact the protective layer 1106 remaining engaged at a periphery of the substrate 1102, and may apply a peeling or separation force to the remaining protective layer 1106. In one embodiment, the disengagement station 1128 is a UV radiation station that debonds the protective layer 1106. The protective layer 1106 is then retracted onto a receptacle 1130, which may be a roller, disposed on each side of the substrate 1102. The substrate 1102 may then be routed to a recycling station 1132 for any preparation to recycle into layer formation. The recycling station 1132 may be a porous material removal station, a substrate cleaning station, and/or a surface preparation station. The porous material removal station may be a mechanical cleaning station, such as a polishing station, or a chemical cleaning station, such as a wet cleaning, dry cleaning, plasma cleaning, etching, or plasma etching station.

After processing in the recycling station 1132, substrates 1102 begin a process of layer formation before returning to the protective layer application stage. The template substrate 1102 may occupy a recycled substrate staging location 1138 after processing in the recycling station 1132, if desired. The template substrate 1102 may be routed to a porous layer formation station 1134, which may be any of the embodiments described in connection with FIGS. 2 and 3. The substrate 1102 may then be routed to an epitaxy station 1136 for formation of epitaxial layers on both sides of the substrate 1102. The epitaxy station 1136 may be any of the embodiments described in connection with FIGS. 4 and 5A-5C. Thus, the apparatus 1100 is a continuous epitaxial substrate producing apparatus.

FIG. 11B is a top view of a portion of the apparatus of FIG. 11A. The portion of the apparatus 1100 visible in FIG. 11B is the portion from the staging location 1140 to the recycled substrate staging location 1138. In the view of FIG. 11B, it is apparent that multiple substrates 1102 may be processed concurrently in each stage of the apparatus 1100 by providing a lateral extent to the apparatus 1100 to accommodate a desired number of substrates 1102. The continuous protective layer 1106 also has a lateral extent that encompasses all substrate being processed concurrently. A plurality of substrate removal tools 1126 may be provided to accommodate multiple substrates being picked up by the layer removal station 1122.

Substrates may be processed in any of the apparatus and methods described herein in a way that results in an edge exclusion around the periphery of the substrate. An edge gripper may be used that substantially shields the edge of the substrate from the processing environment. Alternately, or additionally, a mask layer may be applied to the edge of the substrate, on one side of the substrate or both sides of the substrate, to shield the edge from processing. Edge exclusion may provide advantages for substrate handling by providing a handling area of the substrate that does not become part of a device or final product.

In some embodiments, the force required to debond the epitaxial substrate from the template substrate may be minimized in the process of demarking the boundaries of the substrate to be debonded. As described elsewhere herein, the substrate may be demarked by a scribing process, which may be mechanical or non-mechanical. Sawing, laser scribing, e-beam scribing, and the like, are exemplary methods. The scribing generally produces a trench or groove in the epitaxial surface to facilitate separation of the epitaxial layer from the template substrate. The trench may be any depth, but is typically from about 10% to about 200% of the thickness of the epitaxial layer. When using energy-based means for forming the trench, scribing through the entire thickness of the epitaxial layer, for example from about 100% to 200% of the thickness of the epitaxial layer, may weld the epitaxial layer, at least in part, to the template substrate, increasing the debonding force. Therefore, in some embodiments where an energy-based scribing method is used, the trench may have a depth between about 50% and about 95% of the thickness of the epitaxial layer. In one embodiment, the depth of the trench is 95% of the thickness of the epitaxial layer.

Additionally, in some embodiments debonding may be facilitates by flexing the substrate during the debonding process. Flexing the template substrate, with the epitaxial layer formed thereon, creates shear between the porous layer and the epitaxial layer, enhancing removal of the epitaxial layer. It has been found that, for epitaxial layers having dimension of 156 mm×156 mm, and thickness of 50-75 μm, flexing the template substrate by 100-300 μm during debonding reduces the debonding force by creating shear at the debonding interface.

Using the processes and methods described herein, free-standing, substantially monocrystalline semiconductor substrates of arbitrary dimension can be made. Limitations on the size of such substrates available using the methods and apparatus described herein stem only from the size of the apparatus used to make them. Because no large monocrystalline ingots are used, the substrates described herein are not limited by the size of available ingots, and very large ingots are not required to obtain large substrates. Epitaxial substrates may be made in virtually any desired shape and dimension by selecting a template substrate that supports the desired dimensions and by sizing the processing equipment appropriately. Substantially rectangular epitaxial substrates having a first dimension between about 0.1 m and about 2 m and a second dimension between about 0.1 m and about 2 m may be formed. For example, in one embodiment epitaxial substrates may be formed by using template substrates having dimensions of 125 mm×125 mm, 156 mm×156 mm, 160 mm×160 mm, or 165 mm×165 mm. Applying the edge exclusions dimensions described herein yields epitaxial substrates of dimension 120 mm×120 mm up to about 164 mm×164 mm, not limited to square dimensions. Epitaxial substrates of semiconductor materials available from the methods and apparatus described herein may have a polygonal shape with any desired number of edges, a circular shape, an oval shape, or an irregular shape according to a desired design.

In one aspect, a method of forming an epitaxial semiconductor substrate includes forming a porous layer on two major surfaces of a semiconductor substrate, forming an epitaxial layer on each of the porous layers, separating the epitaxial layers from the substrate by forming fissures through the porous layers, and cleaning the separated epitaxial layers. The epitaxial layers may be formed by concurrently exposing the porous layers to a precursor gas mixture. The epitaxial layers may be separated from the substrate by directing mechanical energy to the substrate through the epitaxial layers. The porous layers may be formed by forming pores in the two major surfaces of the semiconductor substrate. The substrate may be disposed in an electrolyte bath and an electric potential may be applied to the electrolyte bath. The polarity of the electric potential may be reversed during pore formation. The porous layers may be concurrently exposed to the precursor gas mixture by positioning the semiconductor substrate in a processing chamber using an edge gripping susceptor and flowing the precursor gas mixture across both major surfaces of the semiconductor substrate. The porous layers may be sealed before forming the epitaxial layers. The mechanical energy, which may be a cyclical pressure, may be applied remotely by an acoustic transducer or may be applied by a contact actuator.

In another aspect, a method of processing a semiconductor substrate includes forming pores in two major surfaces of the semiconductor substrate to form a porous layer on each major surface of the semiconductor substrate, smoothing the porous layers, forming an epitaxial semiconductor layer on each porous layer, immersing the semiconductor substrate in a fluid medium, directing pressure waves to the epitaxial layers through the fluid medium, which may have an etchant, forming fissures through the porous layers, and separating the epitaxial layers from the porous layers. The fluid medium may comprise an etchant. The pressure waves may be directed to both epitaxial layers concurrently. Each of the porous layers may be a bilayer of a first layer having a first porosity and a second layer having a second porosity different from the first porosity. The first porosity may be less than the second porosity when the second layer is formed over the first layer, or when the second layer is adjacent to an epitaxial layer.

The pressure waves may be directed to both epitaxial layers concurrently, and frequency of the pressure waves, which may be varied, may be selected to maximize energy coupling to the porous layers. The pressure waves may be directed to each epitaxial layer with a power between about 300 W and about 2,000 W. The epitaxial layers may include a first epitaxial layer formed on a first side of the semiconductor substrate and a second epitaxial layer formed on a second side of the semiconductor substrate, and pressure waves directed to the first epitaxial layer may be synchronized with pressure waves directed to the second epitaxial layer. Each epitaxial layer may have a thickness between about 50 μm and about 500 μm. Each of the porous layers may have a thickness between about 0.5 μm and about 2 μm.

In another aspect, an apparatus for separating layers of a substrate may include a chamber, which may have a fluid inlet and a fluid outlet, a substrate support, which may be an edge support, disposed in the chamber and defining a substrate processing plane, and a source of mechanical energy facing the substrate processing plane. The substrate support may be a susceptor with a plurality of substrate locations, each of which may include an edge gripper, and the susceptor may be supported from a side wall of the chamber.

The source of mechanical energy may be an acoustic transducer, which may have a pressure wave emitter and a pressure wave detector, and may include a first source of mechanical energy disposed facing a first side of the substrate processing plane and a second source of mechanical energy is disposed facing a second side of the substrate processing plane opposite the first side. The source of mechanical energy may be a pair of acoustic transducers disposed on opposite sides of the susceptor, and each acoustic transducer may include a pressure wave emitter and a pressure wave detector.

In an embodiment with a first source of mechanical energy and a second source of mechanical energy, each of the first and second sources of mechanical energy may be a contact actuator that contacts a substrate through a contact surface and applies a uniform mechanical stress to the substrate through the contact surface. Each of the contact actuators may be a vacuum applicator, a piezoelectric actuator, or a capacitive actuator. A controller may be coupled to each contact actuator for cycling the mechanical stress at a frequency between about 0.5 Hz and about 100 Hz.

In another aspect, an apparatus for separating layers of a substrate may include a chamber, a substrate support defining a substrate processing plane, a first contact actuator having a first substrate contact surface facing the substrate processing plane, a second contact actuator having a second substrate contact surface facing the substrate processing plane and disposed opposite the substrate processing plane from the first contact actuator, a first mechanical stress source coupled to the first contact actuator, and a second mechanical stress source coupled to the second contact actuator. The first and the second substrate contact surfaces may be vacuum applicators, each of which may be a porous ceramic member or a flexible member and may be fluidly coupled to a vacuum source. Each mechanical stress source may be a vacuum pump, a piezoelectric actuator, or a capacitive actuator. For vacuum pump embodiments, a controller may be provided to cycle each vacuum pump at a frequency between about 0.5 Hz and about 100 Hz.

In another aspect, an apparatus for forming free-standing epitaxial semiconductor substrates may include a pore generation unit, an epitaxy unit, a separation unit, a cleaning unit, and a conveyor connecting the pore generation unit, the epitaxy unit, the separation unit, and the cleaning unit. The pore generation unit may include a tank, a plurality of substrate edge supports, and an electrode at opposite ends of the tank. The epitaxy unit may include a plurality of substrate edge supports coupled to a rotary actuator by a frame, a precursor gas distributor oriented along a rotational axis of the frame, and a radiant heat source distributed around a periphery of the frame. The separation unit may include a chamber, a support for one or more substrates disposed in the chamber, wherein the support may be a ledge attached to a side wall of the chamber, and may define a substrate processing plane, and a mechanical energy source facing the substrate processing plane. The cleaning unit may be a wet cleaning unit.

The epitaxy unit may have a processing chamber in which the frame is disposed during processing and a loading chamber to which the frame is moved for substrate loading and unloading. The precursor gas distributor may have a plurality of openings positioned to direct precursor gas to two major surfaces of each substrate disposed in the plurality of substrate edge supports. The mechanical energy source may be an acoustic transducer, or a pair of acoustic transducers disposed on opposite sides of the substrate processing plane.

In another aspect, an apparatus for forming free-standing epitaxial semiconductor substrates may include a first conveyor for carrying template substrates disposed in a susceptor, a pore generating station having a plurality of susceptor support locations, a second conveyor connecting the pore generating station to an epitaxy station having a plurality of susceptor support locations disposed in a processing chamber, a third conveyor for connecting the epitaxy station to a lamination station that comprises a first source of protective film, a second source of protective film opposite the first source, and a closure member for enclosing a substrate in the protective films, a lateral separation station comprising a scribing device, a layer separation station comprising two sources of mechanical energy facing a substrate processing plane, a layer removal station comprising two rotating layer removal devices, and a substrate recycling station connected to the first conveyor. Each source of protective film may be a roll of film with a UV releasable adhesive. The lateral separation station may have a plurality of scribing devices for scribing multiple substrates concurrently. Each rotating layer removal device may have a plurality of pickup heads, such as vacuum heads, for engaging with multiple substrates concurrently. Each of the sources of mechanical energy may be an acoustic transducer. The substrate recycling station may be a wet cleaning station, and the apparatus may also have a UV processing station for releasing the protective film. In embodiments featuring acoustic transducers, each acoustic transducer may have a controller for varying frequency and power of pressure waves produced by the acoustic transducer. The lateral separation station may have a plurality of laser scribing devices for scribing multiple substrates concurrently.

While the foregoing is directed to embodiments of the invention, other and further embodiments of the invention may be devised without departing from the basic scope thereof.

What is claimed is:

1. An apparatus for separating layers of a substrate, comprising:
   a chamber;
   a susceptor with a plurality of substrate locations disposed in the chamber and defining a substrate processing plane; and
   a source of mechanical energy facing the substrate processing plane, wherein each of the substrate locations comprises an edge gripper, and wherein the source of mechanical energy is an acoustic transducer comprising a pressure wave emitter and a pressure wave detector.

2. The apparatus of claim 1, wherein the susceptor is supported from a side wall of the chamber.

3. The apparatus of claim 1, further comprising a controller coupled to the acoustic transducer.

4. The apparatus of claim 3, wherein the chamber comprises a fluid inlet and a fluid outlet.

5. An apparatus for separating layers of a substrate, comprising:
   a chamber;
   a susceptor with a plurality of substrate locations disposed in the chamber and defining a substrate processing plane; and
   a source of mechanical energy facing the substrate processing plane, wherein each of the substrate locations comprises an edge gripper, and wherein the source of mechanical energy is a pair of acoustic transducers disposed on opposite sides of the susceptor, and each acoustic transducer comprises a pressure wave emitter and a pressure wave detector.

6. An apparatus for separating layers of a substrate, comprising:
   a chamber;
   a substrate support defining a substrate processing plane;
   a first contact actuator having a first substrate contact surface facing the substrate processing plane;
   a second contact actuator having a second substrate contact surface facing the substrate processing plane and disposed opposite the substrate processing plane from the first contact actuator, wherein the first and the second substrate contact surfaces are vacuum applicators, each of which is a porous ceramic member;
   a first mechanical stress source coupled to the first contact actuator; and
   a second mechanical stress source coupled to the second contact actuator, wherein each mechanical stress source is a vacuum pump, and further comprising a controller for cycling each vacuum pump at a frequency between about 0.5 Hz and about 100 Hz.

7. An apparatus for separating layers of a substrate, comprising:
   a chamber;
   a substrate support defining a substrate processing plane;
   a first contact actuator having a first substrate contact surface facing the substrate processing plane;
   a second contact actuator having a second substrate contact surface facing the substrate processing plane and disposed opposite the substrate processing plane from the first contact actuator, wherein the first and the second substrate contact surfaces are vacuum applicators, each of which is a porous ceramic member;

a first mechanical stress source coupled to the first contact actuator; and a second mechanical stress source coupled to the second contact actuator, wherein each mechanical stress source is a piezoelectric actuator.

8. The apparatus of claim 7, further comprising a vacuum source fluidly coupled to each vacuum applicator.

* * * * *